United States Patent
Kashima et al.

(10) Patent No.: US 7,633,987 B2
(45) Date of Patent: Dec. 15, 2009

(54) SEMICONDUCTOR LASER DEVICE AND MANUFACTURING METHOD THEREOF

(75) Inventors: Takayuki Kashima, Hyogo (JP); Kouji Makita, Hyogo (JP); Kenji Yoshikawa, Okayama (JP)

(73) Assignee: Panasonic Corporation, Osaka (JP)

( * ) Notice: Subject to any disclaimer, the term of this patent is extended or adjusted under 35 U.S.C. 154(b) by 29 days.

(21) Appl. No.: 12/166,688

(22) Filed: Jul. 2, 2008

(65) Prior Publication Data

US 2009/0080483 A1  Mar. 26, 2009

(30) Foreign Application Priority Data

Sep. 20, 2007 (JP) ............................. 2007-244068

(51) Int. Cl.
*H01S 5/00* (2006.01)
(52) U.S. Cl. .................. 372/50.121; 372/46.016; 372/49.01
(58) Field of Classification Search ............ 372/46.016, 372/49.01, 50.121
See application file for complete search history.

(56) References Cited

U.S. PATENT DOCUMENTS

| 6,618,420 | B1 | 9/2003 | Gen-Ei et al. |
| 7,068,695 | B2 | 6/2006 | Tanaka |
| 2007/0237199 | A1 | 10/2007 | Kashima et al. |

FOREIGN PATENT DOCUMENTS

JP   2001-057462   2/2001

*Primary Examiner*—Armando Rodriguez
(74) *Attorney, Agent, or Firm*—McDermott Will & Emery LLP

(57) ABSTRACT

A semiconductor laser device includes a first semiconductor laser element and a second semiconductor laser element. The first semiconductor laser element has a first end face window structure that is a region including first impurities formed near an end face, and the second semiconductor laser element has a second end face window structure that is a region including second impurities formed near an end face. The distance from a lower end of a first active layer to a lower end of the first end face window structure is shorter than the distance from a lower end of a second active layer to a lower end of the second end face window structure.

17 Claims, 24 Drawing Sheets

SEMICONDUCTOR LASER DEVICE AND MANUFACTURING METHOD THEREOF

CROSS REFERENCE TO RELATED APPLICATION

This application claims priority under 35 U.S.C. §119 on Patent Application No. 2007-244068 filed in Japan on Sep. 20, 2007, the entire contents of which are hereby incorporated by reference.

BACKGROUND OF THE INVENTION

1. Field of the Invention

The invention generally relates to a semiconductor laser device and a manufacturing method thereof. More particularly, the invention relates to a monolithic semiconductor laser device for emitting laser light of a plurality of wavelengths and a manufacturing method thereof.

2. Background Art

A semiconductor laser device is used as a pickup light source of an optical disc device and a light source for optical information processing, optical communication and optical measurement. For example, an infrared laser device having a 780 nm (nanometer) wavelength band is used as a pickup light source for playing back and recording CDs (Compact Discs) and MDs (Mini Discs). A red laser device having a 650 nm wavelength band is used as a pickup light source for playing back and recording higher density DVDs (Digital Versatile Discs).

There has been a demand for a drive that is compatible with a plurality of types of optical discs such as CDs, MDs, and DVDs. In this case, an infrared laser device and a red laser device need to be mounted on a single drive. However, with recent demand for reduced size and cost, simplified optical adjustment and assembly process, and the like of a drive, an optical integrated unit including a pickup light source needs to be further simplified. Therefore, a dual-wavelength semiconductor laser device in which an infrared laser element having a 780 nm wavelength band and a red laser element having a 650 nm wavelength band are integrated on a common substrate has been used in practical applications (e.g., Japanese Laid-Open Patent Publication No. 2001-57462), which has contributed to significant simplification of an optical integrated unit.

In the future optical disc market, optical discs are required to adapt to LS (LightScribe) for drawing pictures and characters on media labels by using a CD infrared laser and to higher speed DVDs. Improvement in output power of a dual-wavelength laser is essential to meet such a demand.

In order to implement a higher power semiconductor laser device, optical damage at an end face, that is, COD (Catastrophic Optical Damage) degradation, needs to be suppressed. The use of an end face window structure is effective to suppress COD degradation. In formation of the end face window structure, impurities are diffused in an active layer near the light emitting end face of a laser element for equalization of the composition, whereby an effective bandgap near the end face is widened. Light absorption near the end face is thus suppressed by the end face window structure. Accordingly, a negative chain reaction of heat generation near the end face due to light absorption, reduction in bandgap due to the heat generation, and further light absorption due to the reduction in bandgap can be prevented, whereby COD degradation is suppressed.

The structure of a dual-wavelength semiconductor laser device is roughly divided into two types: a hybrid dual-wavelength semiconductor laser device; and a monolithic dual-wavelength semiconductor laser device. The hybrid dual-wavelength semiconductor laser device is fabricated by first producing an infrared laser element and a red laser element individually and then integrated both laser elements on a common substrate in a packaging process. The monolithic dual-wavelength semiconductor laser device is fabricated by producing an infrared laser element and a red laser element on a common substrate. In view of the requirement for higher accuracy of the distance between respective light-emitting points of the infrared laser element and the red laser element, and the mounting yield, the monolithic dual-wavelength semiconductor laser device has become mainstream.

However, the monolithic dual-wavelength semiconductor laser device has a problem that it is difficult to maximize characteristics of each laser element.

In order to implement a higher power monolithic dual-wavelength semiconductor laser device, stable operation at high temperature and high power needs to be assured in addition to the above-mentioned suppression of the COD degradation. Reduction in operating current is important to obtain stable operation at high temperature and high power. Suppression of carrier overflow in the active layer is necessary to reduce the operating current.

In an infrared laser element having an active layer made of an AlGaAs (aluminum gallium arsenide)-based material, carrier overflow can be suppressed by using a cladding layer made of an AlGaInP (aluminum gallium indium phosphide)-based material having a wide bandgap. However, if impurity diffusion is excessively conducted in the AlGaInP-based cladding layer in the process of forming an end face window structure, a wavelength shift amount (the difference in wavelength between a gain region and a window region) is reduced. Excessive impurity diffusion causes pileup of impurities in the active layer. Such impurity pileup causes an impurity state in the active layer and contamination of the active layer with indium (In) from the cladding layer, thereby reducing the bandgap in the end face window region. As a result, light absorption in the end face window structure is increased and characteristics of the infrared laser element such as COD are degraded.

On the other hand, in a red laser element having an active layer made of an AlGaInP-based material, problems such as reduction in wavelength shift amount as in the infrared laser element does not occur when the cladding layer is made of AlGaInP. Therefore, it is preferable to form a large end face window structure by diffusing impurities in the cladding layer as much as possible. However, if impurity diffusion reaches a GaAs (gallium arsenide) buffer layer beyond the AlGaInP-based cladding layer, a leakage current is generated and characteristics of the semiconductor laser are degraded.

In order to obtain a higher power monolithic dual-wavelength semiconductor laser device, the impurity diffusion process for forming the end face window structure needs to be optimized for each of the infrared laser element and the red laser element.

On the other hand, a simplified manufacturing process and improved yield are essential for cost reduction of the monolithic dual-wavelength laser device. The impurity diffusion process for forming the end face window structure involves heat history. Therefore, when the infrared laser element and the red laser element are individually formed with heat history in the monolithic dual-wavelength semiconductor laser device, excessive impurity diffusion may occur in the laser gain portion, which may result in reduction in reliability. Accordingly, it is desirable that the end face window structure can be stably formed in the infrared laser element and the red laser element simultaneously. Moreover, it is preferable that process conditions are standardized even when the window structure is formed individually in the infrared laser element and the red laser element.

SUMMARY OF THE INVENTION

The invention is made in view of the above problems and it is an object of the invention to implement a high-power, low-cost monolithic dual- or multi-wavelength laser device.

In order to achieve the above object, a semiconductor laser device according to the invention is structured so that a lower end of an end face window structure of a first laser element is located higher than a lower end of an end face window structure of a second laser element.

More specifically, a semiconductor laser device according to the invention includes a first semiconductor laser element and a second semiconductor laser element formed on a semiconductor substrate of a first conductivity type. The first semiconductor laser element has a first first-conductivity-type cladding layer, a first active layer including an $Al_xGa_{1-x}As$ layer (where $0 \leq x \leq 1$), a first second-conductivity-type cladding layer, and a first contact layer which are sequentially formed on the semiconductor substrate in this order, and has a first end face window structure that is a region including first impurities and formed near an end face. The second semiconductor laser element has a second first-conductivity-type cladding layer, a second active layer including an $(Al_yGa_{1-y})_zIn_{1-z}P$ layer (where $0 \leq y \leq 1$, $0 \leq z \leq 1$), a second second-conductivity-type cladding layer, and a second contact layer which are sequentially formed on the semiconductor substrate in this order, and has a second end face window structure that is a region including second impurities and formed near an end face. At least one of the first first-conductivity-type cladding layer and the first second-conductivity-type cladding layer contains indium (In). A lower end of the first end face window structure is located above a lower end of the first first-conductivity-type cladding layer. A distance from a lower end of the first active layer to the lower end of the first end face window structure is shorter than a distance from a lower end of the second active layer to a lower end of the second end face window structure.

According to the structure of the semiconductor laser device of the invention, impurities are less likely to be piled up in the first semiconductor laser element having the AlGaAs-based first active layer. This can suppress reduction in wavelength shift caused by the impurity pileup and contamination with In, whereby COD degradation is less likely to occur in the first semiconductor laser element. Moreover, equalization of the composition proceeds efficiently in the semiconductor laser element having the AlGaInP-based second active layer, whereby wavelength shift can be increased. Accordingly, both outputs of the first semiconductor laser element and the second semiconductor laser element can be improved. Moreover, the impurity diffusion rate is lower in an AlGaAs-based material than in an AlGaInP-based material. Therefore, in the case where the end face window structures are formed by impurity diffusion, the lower end of the second end face window structure can be easily made to be located lower than the lower end of the first end face window structure by controlling the thickness of the second contact layer. As a result, a high-power, low-cost monolithic multi-wavelength semiconductor laser device can be implemented.

A method for manufacturing a semiconductor laser device according to the invention includes the steps of: (a) forming on a semiconductor substrate of a first conductivity type a first semiconductor layer having a first first-conductivity-type cladding layer, a first active layer including an $Al_xGa_{1-x}As$ layer (where $0 \leq x \leq 1$), and a first second-conductivity-type cladding layer; (b) implanting first impurities to an end face region of the first semiconductor layer; (c) after the step (b), selectively removing the first semiconductor layer; (d) after the step (c), forming a second semiconductor layer having a second first-conductivity-type cladding layer, a second active layer including an $(Al_yGa_{1-y})_zIn_{1-z}P$ layer (where $0 \leq y \leq 1$, $0 \leq z \leq 1$), and a second second-conductivity-type cladding layer; and (e) disordering a region from an upper portion of the second semiconductor layer at least to the second active layer by introducing second impurities to an end face region of the second semiconductor layer.

According to the method for manufacturing a semiconductor device of the invention, the distance from the lower end of the first active layer to the lower end of the first end face window structure can easily be made shorter than the distance from the lower end of the second active layer to the lower end of the second end face window structure without increasing the number of diffusion steps. Accordingly, a high-power, low-cost monolithic multi-wavelength semiconductor laser device can be implemented.

BRIEF DESCRIPTION OF THE DRAWINGS

FIGS. 6A, 6B, and 6C illustrate a step of a method for manufacturing a semiconductor laser device according to the first embodiment of the invention, wherein FIG. 6A is a plan view, FIG. 6B is a cross-sectional view taken along line VIb-VIb in FIG. 6A, and FIG. 6C is a cross-sectional view taken along line VIc-VIc in FIG. 6A;

FIGS. 7A, 7B, and 7C illustrate a step of the method for manufacturing a semiconductor laser device according to the first embodiment, wherein FIG. 7A is a plan view, FIG. 7B is a cross-sectional view taken along line VIIb-VIIIb in FIG. 7A, and FIG. 7C is a cross-sectional view taken along line VIIc-VIIc in FIG. 7A;

FIGS. 8A, 8B, and 8C illustrate a step of the method for manufacturing a semiconductor laser device according to the first embodiment, wherein FIG. 8A is a plan view, FIG. 8B is a cross-sectional view taken along line VIIIb-VIIIb in FIG. 8A, and FIG. 8C is a cross-sectional view taken along line VIIIc-VIIIc in FIG. 8A;

FIGS. 9A, 9B, and 9C illustrate a step of the method for manufacturing a semiconductor laser device according to the first embodiment, wherein FIG. 9A is a plan view, FIG. 9B is a cross-sectional view taken along line IXb-IXb in FIG. 9A, and FIG. 9C is a cross-sectional view taken along line IXc-IXc in FIG. 9A;

FIGS. 10A, 10B, and 10C illustrate a step of the method for manufacturing a semiconductor laser device according to the first embodiment, wherein FIG. 10A is a plan view, FIG. 10B is a cross-sectional view taken along line Xb-Xb in FIG. 10A, and FIG. 10C is a cross-sectional view taken along line Xc-Xc in FIG. 10A;

FIGS. 11A, 11B, and 11C illustrate a step of the method for manufacturing a semiconductor laser device according to the first embodiment, wherein FIG. 11A is a plan view, FIG. 11B is a cross-sectional view taken along line XIb-XIb in FIG. 11A, and FIG. 11C is a cross-sectional view taken along line XIc-XIc in FIG. 11A;

FIGS. 12A, 12B, and 12C illustrate a step of the method for manufacturing a semiconductor laser device according to the first embodiment, wherein FIG. 12A is a plan view, FIG. 12B is a cross-sectional view taken along line XIIb-XIIb in FIG. 12A, and FIG. 12C is a cross-sectional view taken along line XIIc-XIIc in FIG. 12A;

FIGS. 21A, 21B, and 21C illustrate a step of a method for manufacturing a semiconductor laser device according to the third embodiment of the invention, wherein FIG. 21A is a plan view, FIG. 21B is a cross-sectional view taken along line XXIb-XXIb in FIG. 21A, and FIG. 21C is a cross-sectional view taken along line XXIc-XXIc in FIG. 21A;

FIGS. 22A, 22B, and 22C illustrate a step of the method for manufacturing a semiconductor laser device according to the third embodiment, wherein FIG. 22A is a plan view, FIG. 22B is a cross-sectional view taken along line XXIIb-XXIIb in FIG. 22A, and FIG. 22C is a cross-sectional view taken along line XXIIc-XXIIc in FIG. 22A;

FIGS. 23A, 23B, and 23C illustrate a step of the method for manufacturing a semiconductor laser device according to the third embodiment, wherein FIG. 23A is a plan view, FIG. 23B is a cross-sectional view taken along line XXIIIb-XXIIIb in FIG. 23A, and FIG. 23C is a cross-sectional view taken along line XXIIIc-XXIIIc in FIG. 23A; and FIGS. 24A, 24B, and 24C illustrate a step of the method for manufacturing a semiconductor laser device according to the third embodiment, wherein FIG. 24A is a plan view, FIG. 24B is a cross-sectional view taken along line XXIVb-XXIVb in FIG. 24A, and FIG. 24C is a cross-sectional view taken along line XXIVc-XXIVc in FIG. 24A.

DETAILED DESCRIPTION OF THE PREFERRED EMBODIMENTS

First Embodiment

Figure 1:
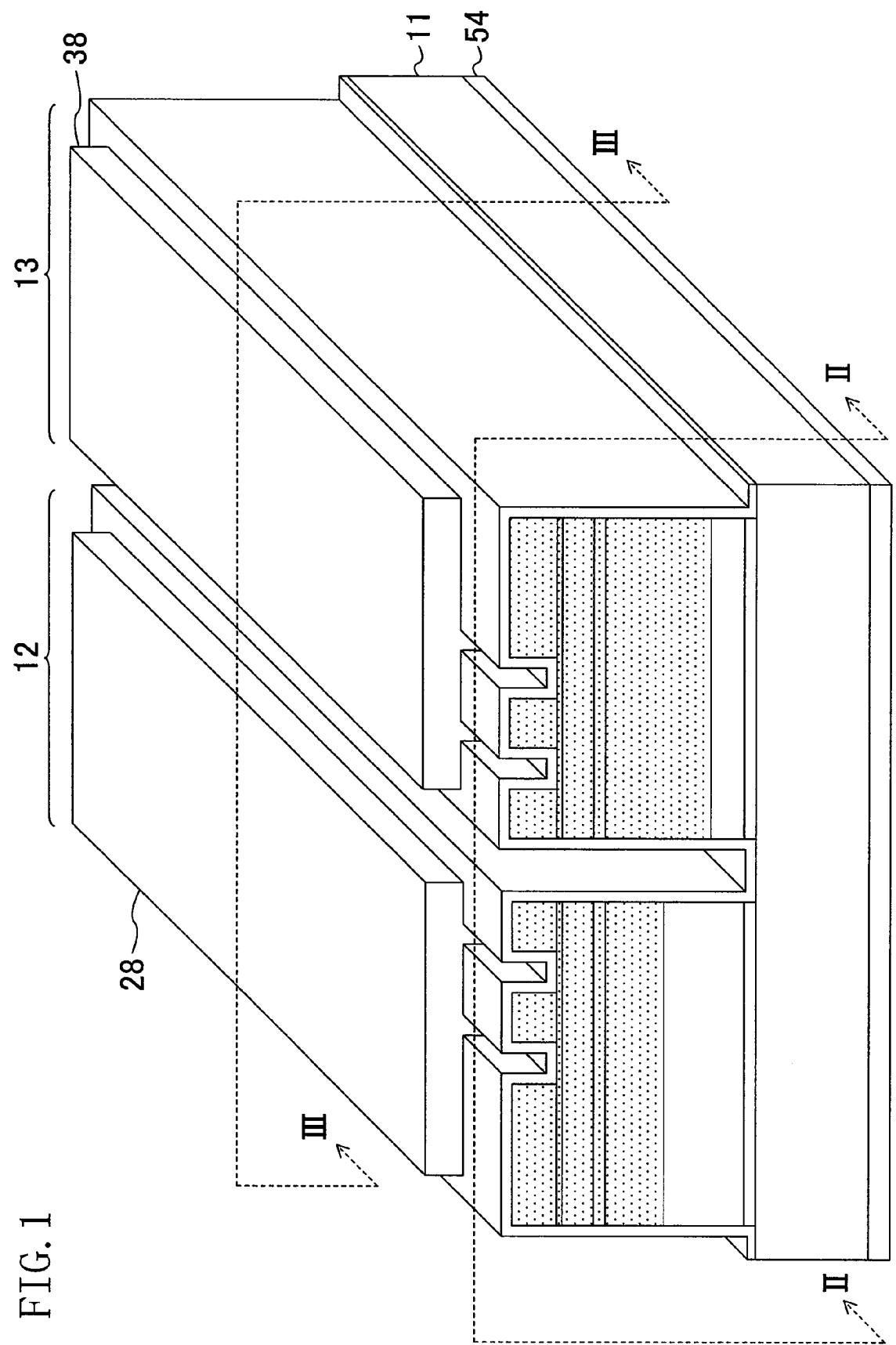
FIG. 1 is a bird's eye view of a semiconductor laser device according to a first embodiment of the invention.
Figure 2:
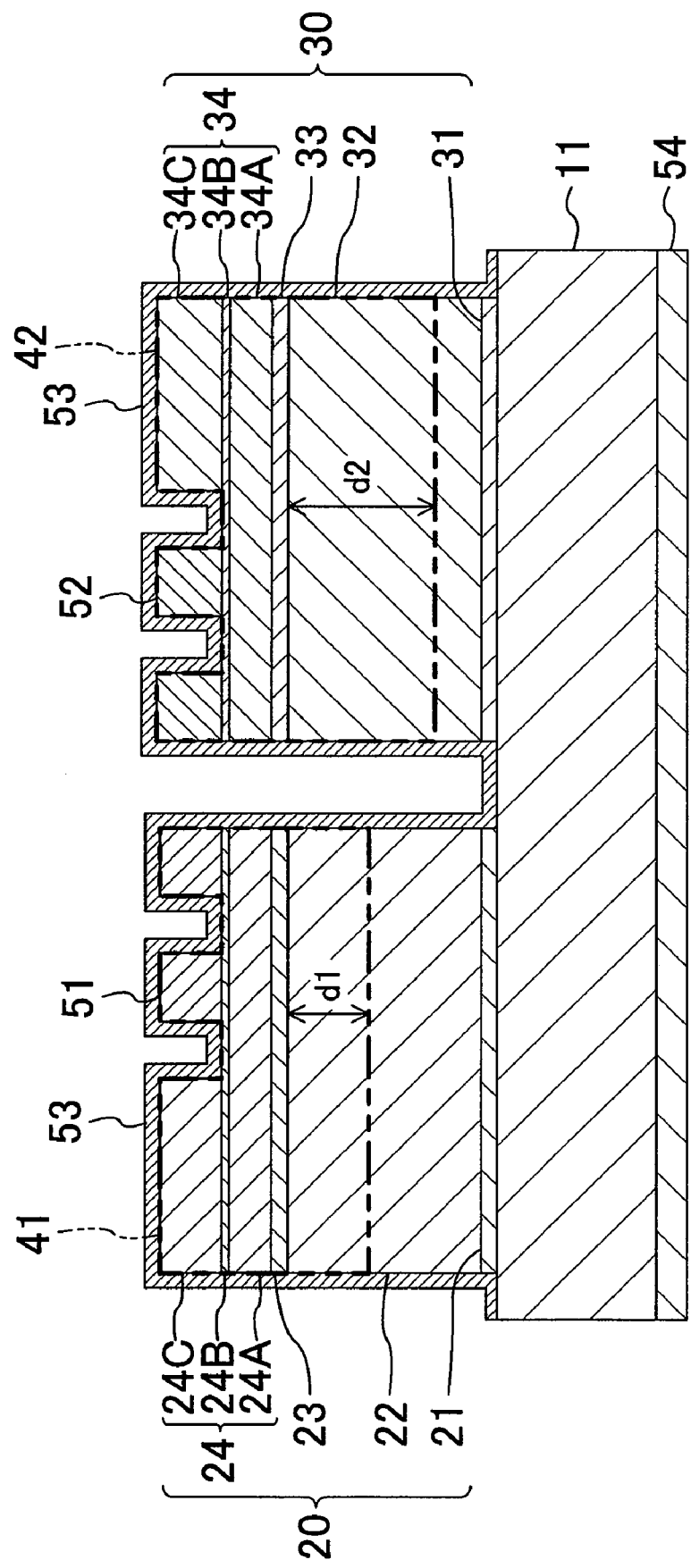
FIG. 2 is a cross-sectional view of the semiconductor laser device of the first embodiment taken along line II-II in FIG. 1.

Hereinafter, a first embodiment of the invention will be described with reference to the figures. FIG. 1 shows a structure of a semiconductor laser device according to the first embodiment. FIG. 2 shows a structure of a cross section (a window region) taken along line II-II in FIG. 1, and FIG. 3 shows a structure of a cross section (a gain region) taken along line III-III in FIG. 1.

Figure 3:
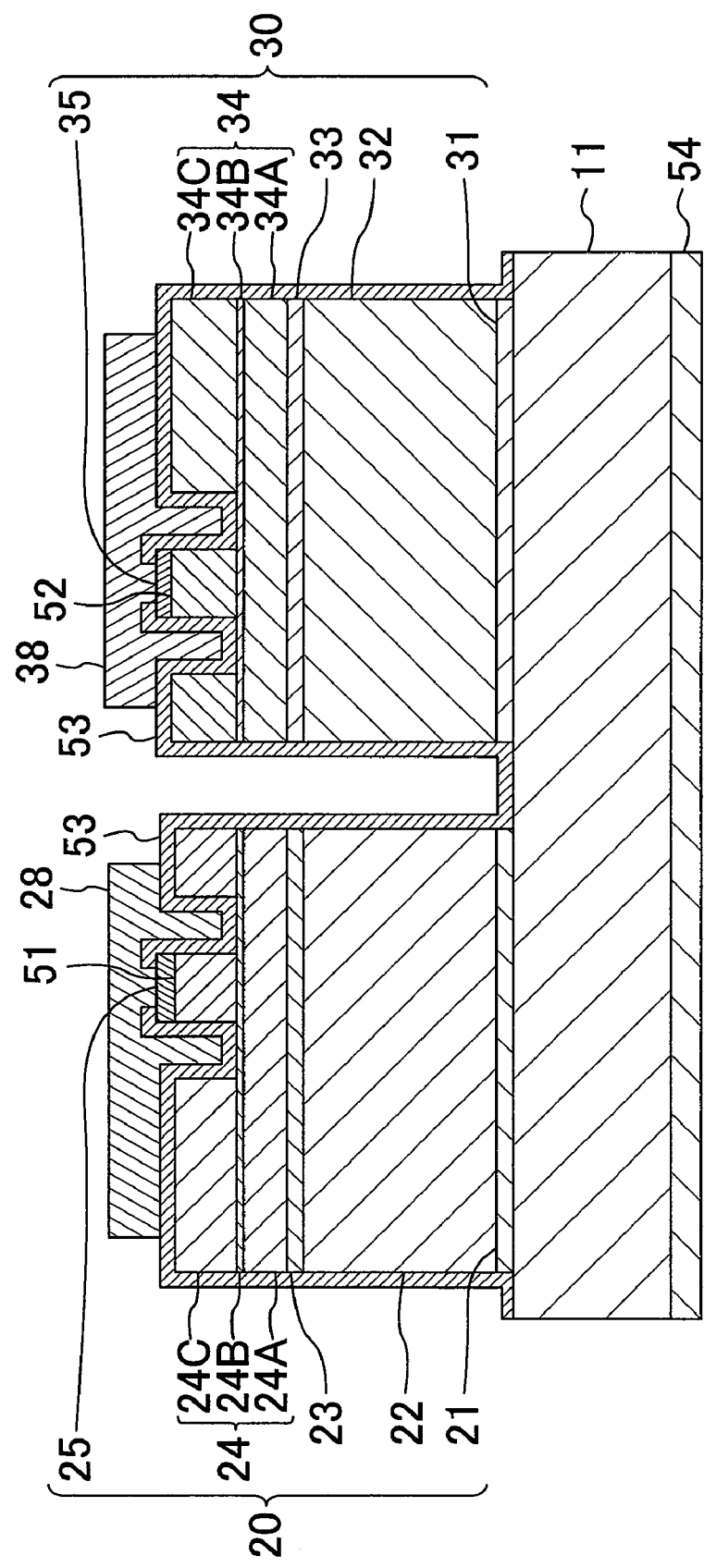
FIG. 3 is a cross-sectional view of the semiconductor laser device of the first embodiment taken along line III-III in FIG. 1.

As shown in FIGS. 1 through 3, the semiconductor laser device of this embodiment is a monolithic dual-wavelength semiconductor laser device including an infrared laser element 12 and a red laser element 13 which are formed on an n-type GaAs (gallium arsenide) semiconductor substrate 11.

The infrared laser element 12 has a first semiconductor layer 20. The first semiconductor layer 20 includes a first buffer layer 21, a first n-type cladding layer 22, a first active layer 23, a first p-type cladding layer 24, and a first contact layer 25 which are sequentially formed on the semiconductor substrate 11. The first active layer 23 is a multiple quantum well active layer including an $Al_xGa_{1-x}As$ layer ($0 \leq x \leq 1$), and an oscillation wavelength is around 780 nm.

The red laser element 13 has a second semiconductor layer 30. The second semiconductor layer 30 includes a second buffer layer 31, a second n-type cladding layer 32, a second active layer 33, a second p-type cladding layer 34, and a second contact layer 35 which are sequentially formed on the semiconductor substrate 11. The second active layer 33 is a multiple quantum well active layer including an $(Al_yGa_{1-y})_z In_{1-z}P$ layer ($0 \leq y \leq 1, 0 \leq z \leq 1$), and an oscillation wavelength is around 650 nm.

The first p-type cladding layer 24 includes a first lower layer 24A, a first etch stop layer 24B, and a first upper layer 24C. The second p-type cladding layer 34 includes a second lower layer 34A, a second etch stop layer 34B, and a second upper layer 34C. The first upper layer 24C and the second upper layer 34C are partially removed in a stripe shape so as to have a first ridge stripe portion 51 and a second ridge stripe portion 52 for current injection, respectively. The first semiconductor layer 20 and the second semiconductor layer 30 are covered by a current blocking layer 53. The current blocking layer 53 has an opening that exposes the first contact layer 25 formed on the first ridge stripe portion 51 and an opening that exposes the second contact layer 35 formed on the second ridge stripe portion 52.

A first p-side electrode 28 is formed on the gain region of the first semiconductor layer 20. The first p-side electrode 28 is in contact with the first contact layer 25 that is exposed from the opening. A second p-side electrode 38 is formed on the gain region of the second semiconductor layer 30. The second p-side electrode 38 is in contact with the second contact layer 35 that is exposed from the opening. An n-side electrode 54 is formed on an opposite surface (a rear surface) to the surface on which the first semiconductor layer 20 and the second semiconductor layer 30 are formed on the semiconductor substrate 11.

The infrared laser element 12 has a first end face window structure 41 formed on the side of an emitting end face and a rear end face. The red laser element 13 has a second end face window structure 42 formed on the side of the emitting end face and the rear end face. A distance d1 from a lower end of the first active layer 23 to a lower end of the first end face window structure 41 is equal to or less than a distance d2 from a lower end of the second active layer 33 to a lower end of the second end face window structure 42. Note that the lower end of the end face window structure is herein a position where the impurity concentration becomes less than $1 \times 10^{17}$ cm$^{-3}$.

The reason why both the infrared laser element 12 and the red laser element 13 can be optimized with this structure will now be described.

Figure 4:
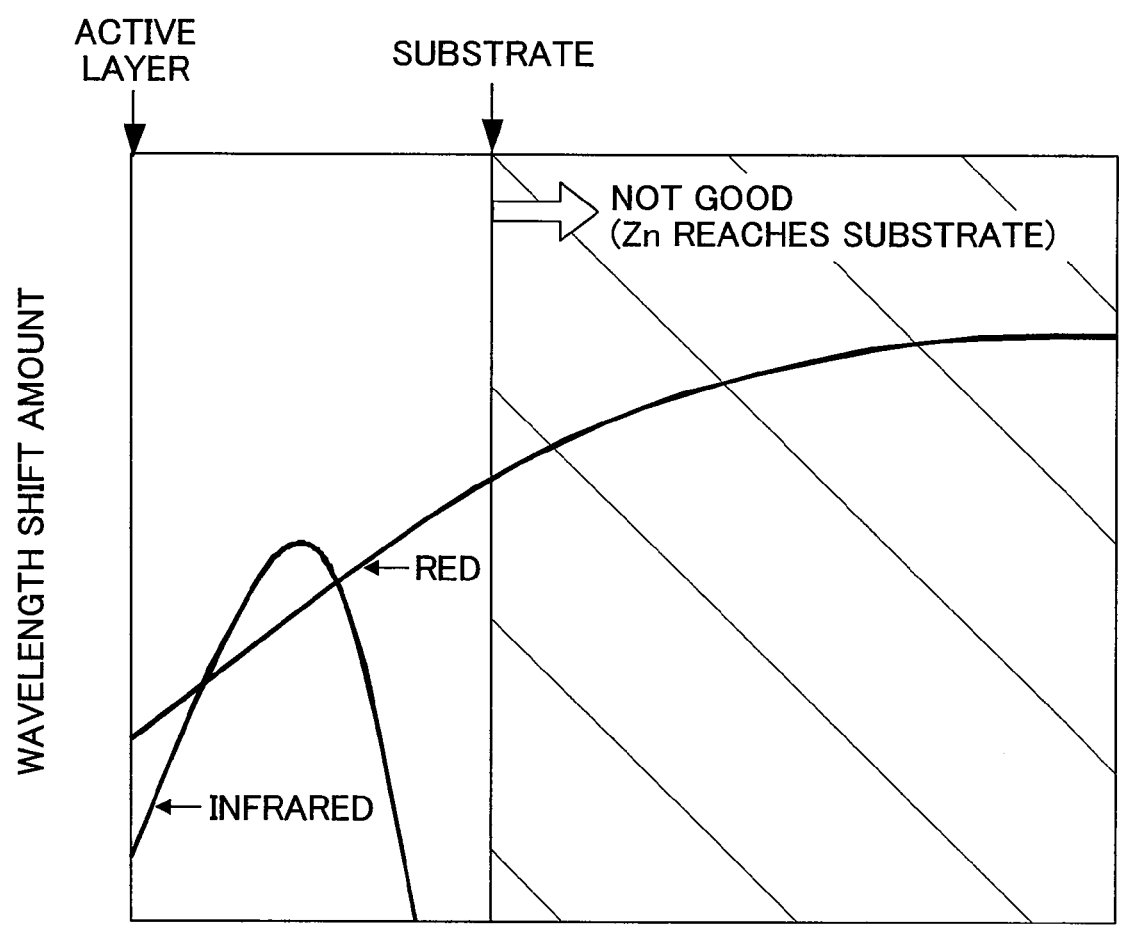
FIG. 4 is a graph showing a relation between the position of a lower end of an end face window structure and a wavelength shift amount in an infrared laser element and a red laser element.

FIG. 4 shows a relation between the distance from the lower end of the active layer to the lower end of the end face window structure and the wavelength shift amount. The wavelength shift amount herein means the difference between an absorbed wavelength in the gain region and an absorbed wavelength in the end face window structure. The larger the wavelength shift amount, the wider the bandgap in the end face window structure is and the smaller the amount of light absorption in the end face window structure is. In other words, the larger the wavelength shift amount is, the less likely COD degradation is to occur. Therefore, a larger wavelength shift amount is preferable for a high-power semiconductor laser device.

As shown in FIG. 4, in the red laser element, the wavelength shift amount increases with an increase in the distance from the lower end of the active region to the lower end of the end face window structure. Accordingly, in the red laser element, it is preferable to diffuse impurities as much as possible to expand the end face window structure. However, when the lower end of the end face window structure reaches the substrate, the substrate is contaminated with impurities. This is not preferable because the substrate is usually of an n-type and impurities such as Zn (zinc) for forming the end face window structure are usually of p-type and therefore electrical characteristics will degrade.

In the infrared laser element, on the other hand, the wavelength shift amount first increases with an increase in the distance from the lower end of the active region to the lower end of the end face window structure. However, the wavelength shift amount starts to decrease as the distance further increases. The reason why this phenomenon occurs has not been clarified, but the following two causes can be considered: first, excessive impurity diffusion may cause pileup of impurities in the active layer, whereby an impurity state may be formed in the active layer. Second, in the infrared laser element, the cladding layer is usually a layer that contains In and the active layer is usually a layer that does not contain In. Excessive impurity diffusion may cause contamination of the active layer with In contained in the cladding layer, whereby the bandgap in the end face window region may be narrowed.

It is therefore preferable in the infrared laser element to suppress impurity diffusion and make the distance from the lower end of the active layer to the lower end of the end face window structure relatively short. On the other hand, it is preferable in the red laser element to cause sufficient impurity diffusion and make the distance from the lower end of the active layer to the lower end of the end face window structure relatively long.

Figure 5:
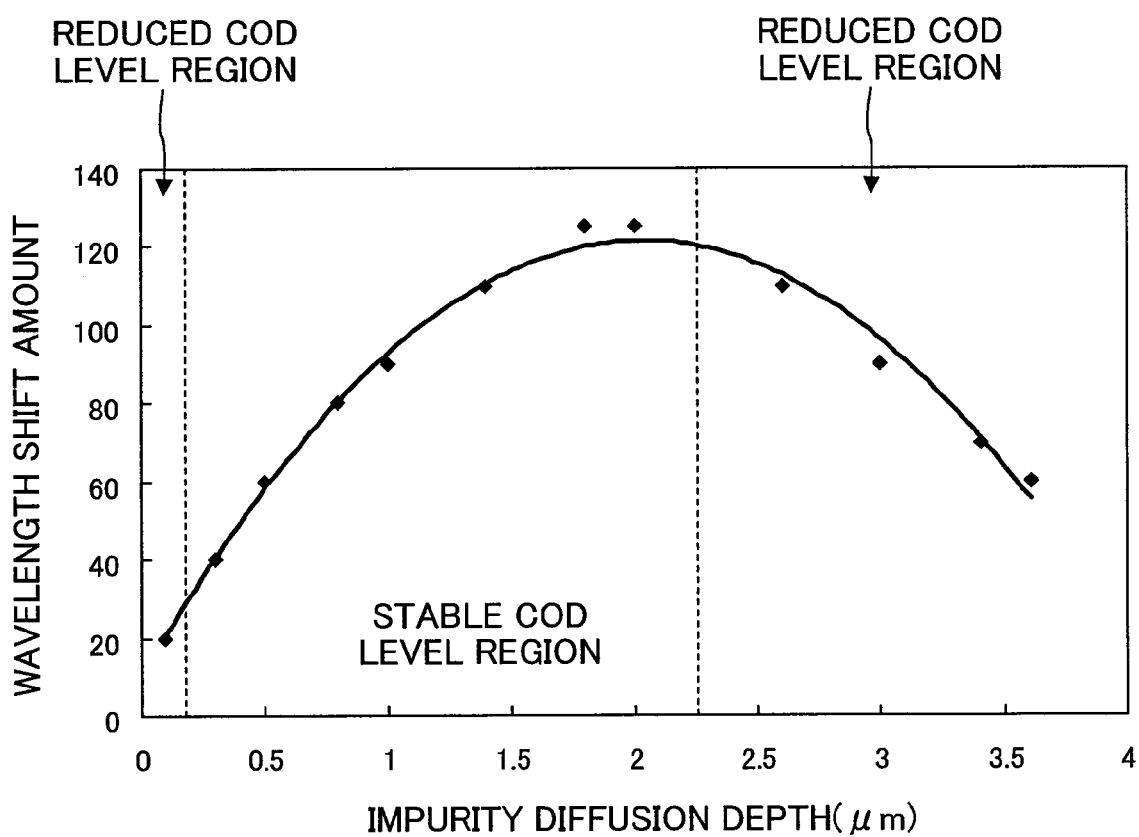
FIG. 5 is a graph showing a relation between an impurity diffusion depth and a wavelength shift amount in an infrared laser element of the semiconductor laser device of the first embodiment.

FIG. 5 shows in further detail a relation between the distance from the lower end of the first active layer 23 to the lower end of the first end face window structure 41 and the wavelength shift amount in a common infrared laser element in which the first n-type cladding layer 22 has a thickness of 4 µm. As shown in FIG. 5, the wavelength shift amount increases until the distance from the lower end of the first active layer 23 to the lower end of the first end face window structure 41, that is, the impurity diffusion depth in the first n-type cladding layer 22, reaches about 2 µm. However, the wavelength shift amount starts to decrease when the distance exceeds about 2 µm. Therefore, when the distance is more than about 2 µm, COD degradation is likely to occur and a stable laser element cannot be obtained. COD degradation is also likely to occur when the impurity diffusion depth in the first n-type cladding layer 22 is less than 0.2 µm. Therefore, it is preferable in the infrared laser element that the distance from the lower end of the first active layer 23 to the lower end of the first end face window structure 41 is in the range of 0.2 µm to 2 µm.

Hereinafter, a method for manufacturing a semiconductor laser device according to the first embodiment will be described with reference to the figures. In FIGS. 6A through 12C, FIGS. 6A, 7A, 8A, 9A, 10A, 11A, and 12A show a planar structure, FIGS. 6B, 7B, 8B, 9B, 10B, 11B, and 12B show a cross-sectional structure in the gain region, and FIGS. 6C, 7C, 8C, 9C, 10C, 11C, and 12C show a cross-sectional structure in the end face region. Note that, in an actual manufacturing process, a plurality of semiconductor laser devices are formed on a substrate and the substrate is finally cleaved into individual semiconductor laser devices. However, only one semiconductor laser device is shown in the figures for explanation.

Figure 6A:
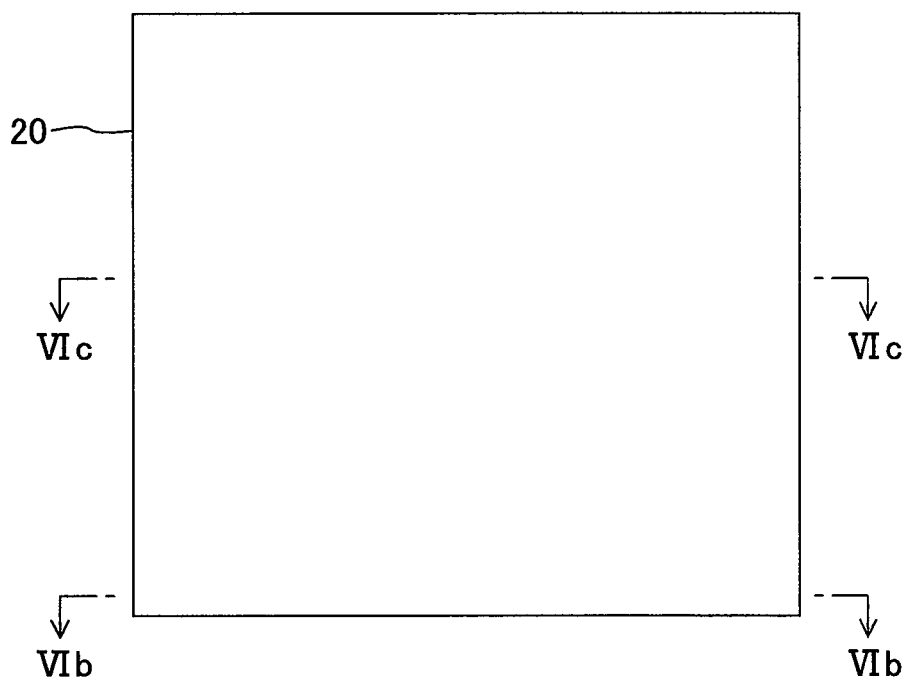
Figure 6B:
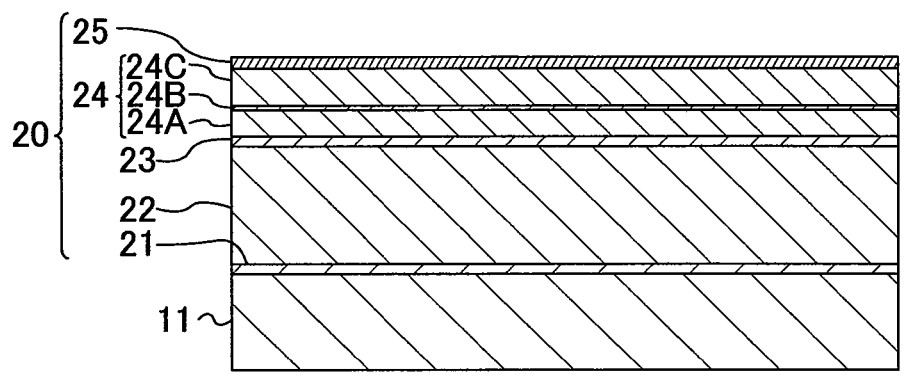
Figure 6C:
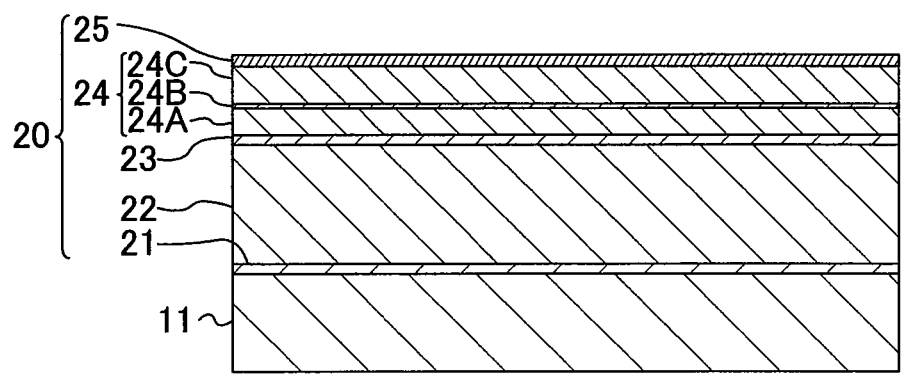

As shown in FIGS. 6A through 6C, a first semiconductor layer 20 is formed by crystal growth on an n-type GaAs semiconductor substrate 11. More specifically, a first buffer layer 21, a first n-type cladding layer 22, a first active layer 23, a first p-type cladding layer 24, and a first contact layer 25 are sequentially formed on the semiconductor substrate 11. The first buffer layer 21 is made of n-type GaAs. The first n-type cladding layer 22 is made of n-type $(Al_yGa_{1-y})_zIn_{1-z}P$ ($0 \leq y \leq 1$, $0 \leq z \leq 1$). The first p-type cladding layer 24 is formed by a first lower layer 24A made of p-type $(Al_yGa_{1-y})_zIn_{1-z}P$ ($0 \leq y \leq 1$, $0 \leq z \leq 1$), a first etch stop layer 24B made of p-type $Al_xGa_{1-x}As$ ($0 \leq x \leq 1$), and a first upper layer 24C made of p-type $(Al_yGa_{1-y})_zIn_{1-z}P$ ($0 \leq y \leq 1$, $0 \leq z \leq 1$). The first contact layer 25 is made of $Al_xGa_{1-x}As$ ($0 \leq x \leq 1$).

The composition of each layer can be selected as appropriate within the above range. For example, in this embodiment, it is assumed that the composition of the first n-type cladding layer 22, the first lower layer 24A, and the first upper layer 24C is $(Al_{0.7}Ga_{0.3})_{0.3}In_{0.7}P$, the composition of the first etch stop layer 24B is $Al_{0.4}Ga_{0.5}As$, and the composition of the first contact layer 25 is GaAs.

Figure 7A:
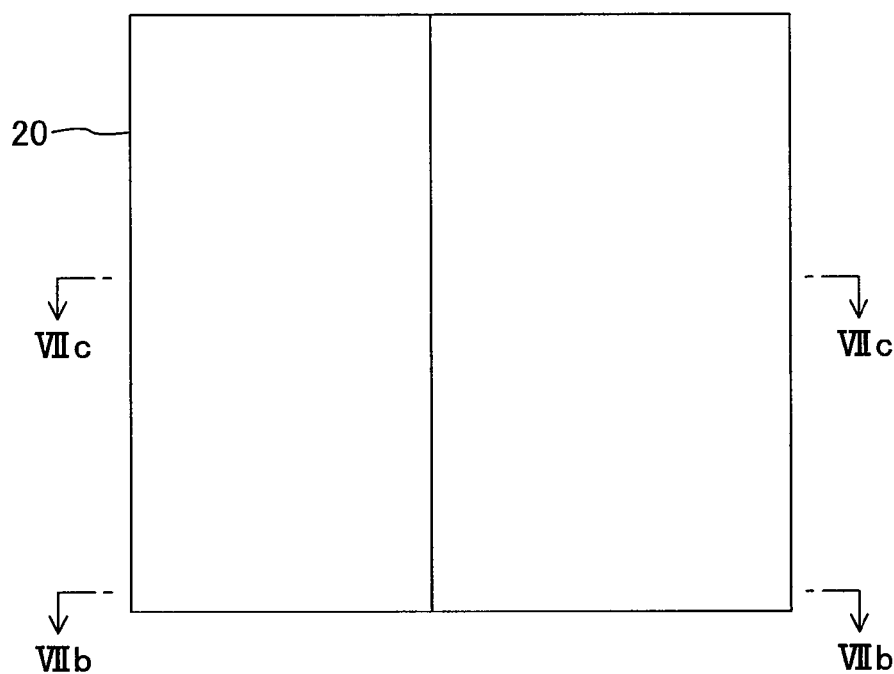
Figure 7B:
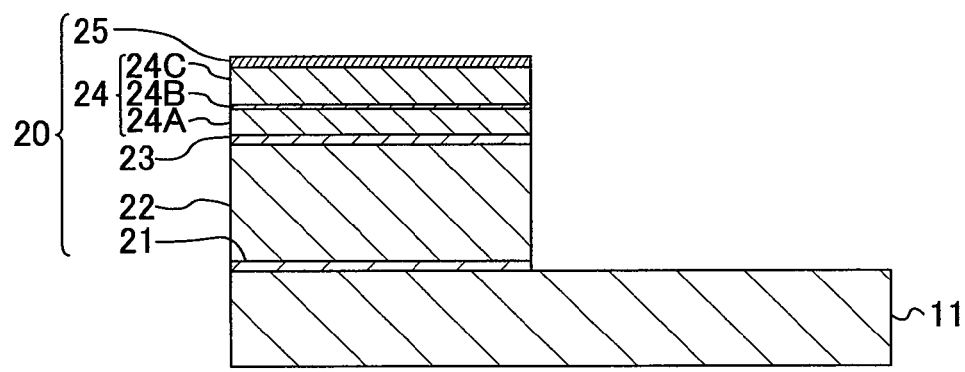
Figure 7C:
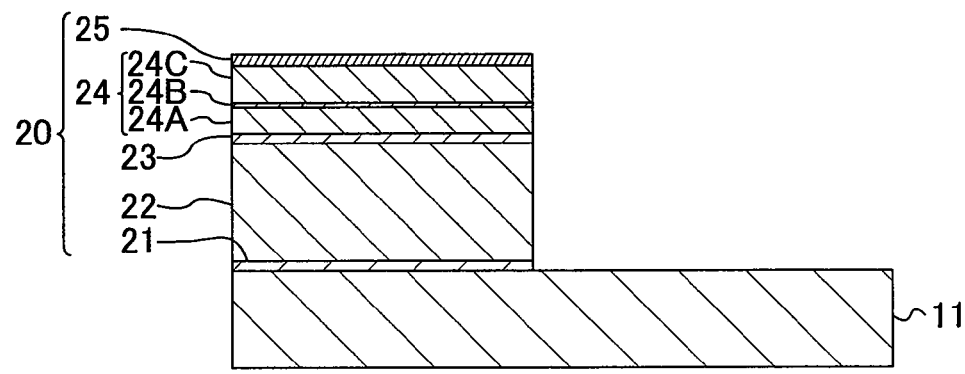

As shown in FIGS. 7A through 7C, a part of the first semiconductor layer 20 which is formed in a formation region of the red laser element is then selectively removed.

Figure 8A:
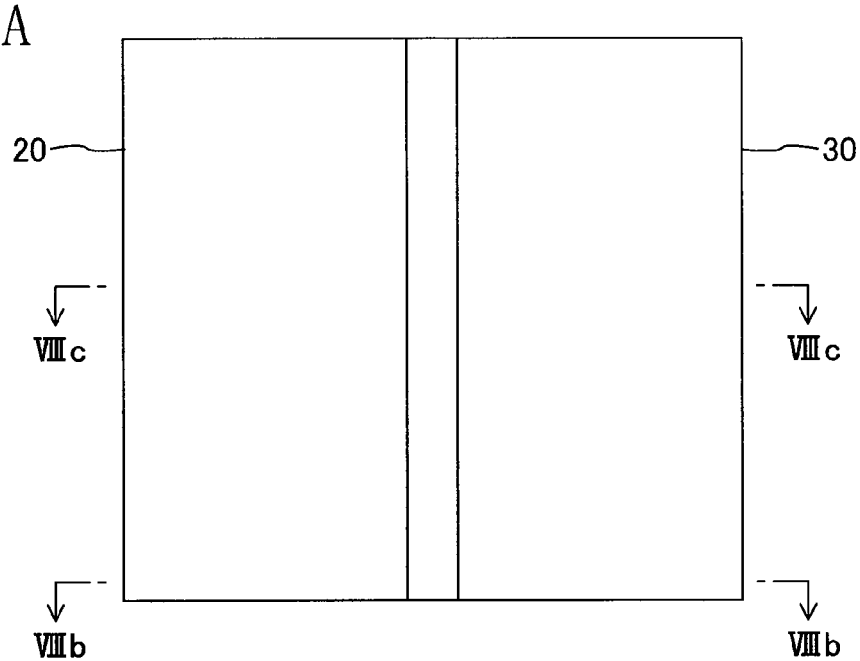
Figure 8B:
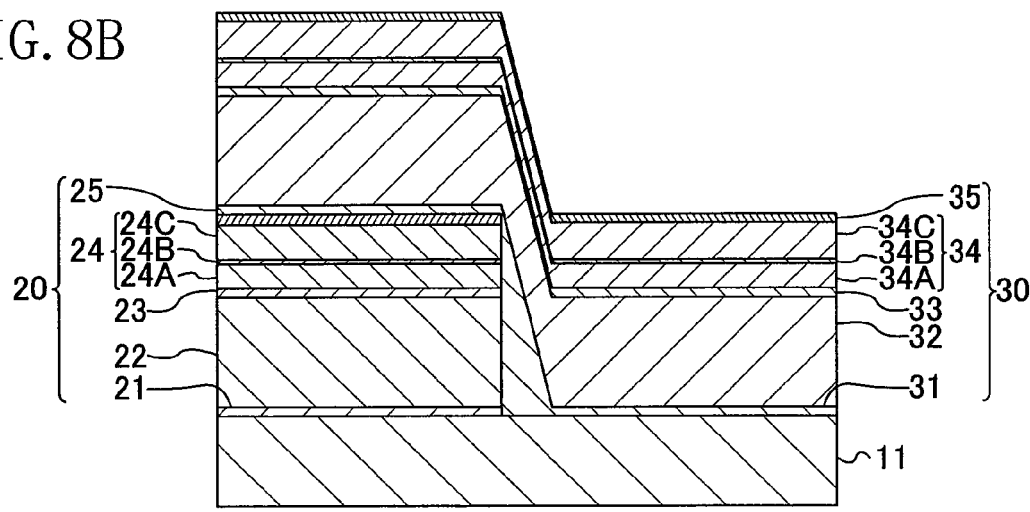
Figure 8C:
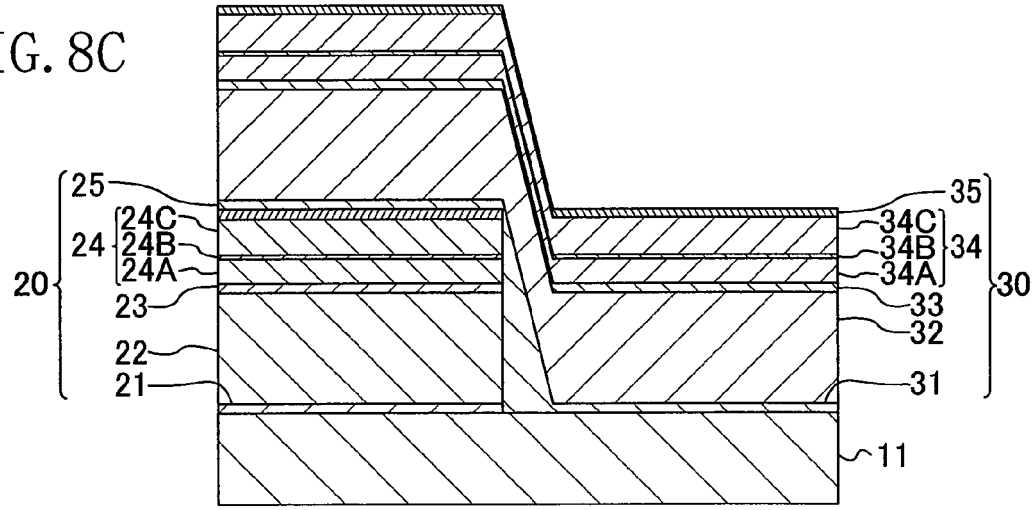

As shown in FIGS. 8A through 8C, a second semiconductor layer 30 is then formed by crystal growth on the semiconductor substrate 11. More specifically, a second buffer layer 31, a second n-type cladding layer 32, a second active layer 33, a second p-type cladding layer 34, and a second contact layer 35 are sequentially formed on the semiconductor substrate 11. The second buffer layer 31 is made of n-type GaAs. The second n-type cladding layer 32 is made of n-type $(Al_yGa_{1-y})_zIn_{1-z}P$ ($0 \leq y \leq 1$, $0 \leq z \leq 1$). The second p-type cladding layer 34 is formed by a second lower layer 34A made of p-type $(Al_yGa_{1-y})_zIn_{1-z}P$ ($0 \leq y \leq 1$, $0 \leq z \leq 1$), a second etch stop layer 34B made of p-type $(Al_yGa_{1-y})_zIn_{1-z}P$ ($0 \leq y \leq 1$, $0 \leq z \leq 1$), and a second upper layer 34C made of p-type $(Al_yGa_{1-y})_zIn_{1-z}P$ ($0 \leq y \leq 1$, $0 \leq z \leq 1$). The second contact layer 35 is made of $Al_xGa_{1-x}As$ ($0 \leq x \leq 1$).

The composition of each layer can be selected as appropriate within the above range. For example, in this embodiment, it is assumed that the composition of the second n-type cladding layer 32, the second lower layer 34A, and the second upper layer 34C is $(Al_{0.7}Ga_{0.3})_{0.3}In_{0.7}P$, the composition of the second etch stop layer 34B is $Ga_{0.5}In_{0.5}P$, and the composition of the second contact layer 35 is GaAs.

Preferably, the first semiconductor layer 20 and the second semiconductor layer 30 are formed so that the thickness of the first contact layer 25 is equal to or larger than that of the second contact layer 35. In this embodiment, the first contact layer 25 has a thickness of 0.3 µm, and the second contact layer 35 has a thickness of 0.2 µm. Preferably, the thickness of the first p-type cladding layer 24 is equal to or smaller than that of the second p-type cladding layer 34. In this embodiment, the first upper layer 24C of the first p-type cladding layer 24 has a thickness of 1.6 µm, and the second upper layer 34C of the second p-type cladding layer 34 has a thickness of 1.7 µm.

Figure 9A:
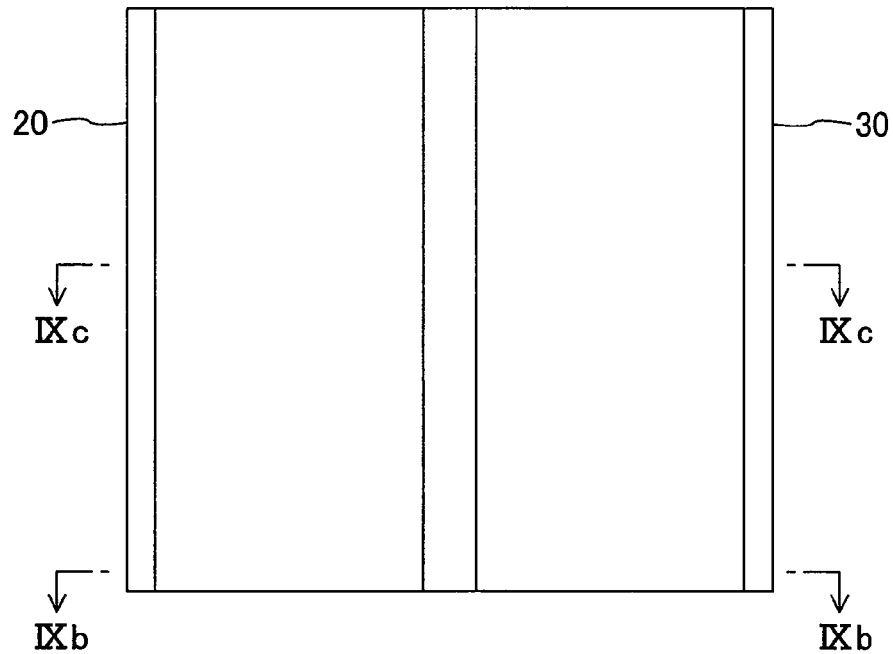
Figure 9B:
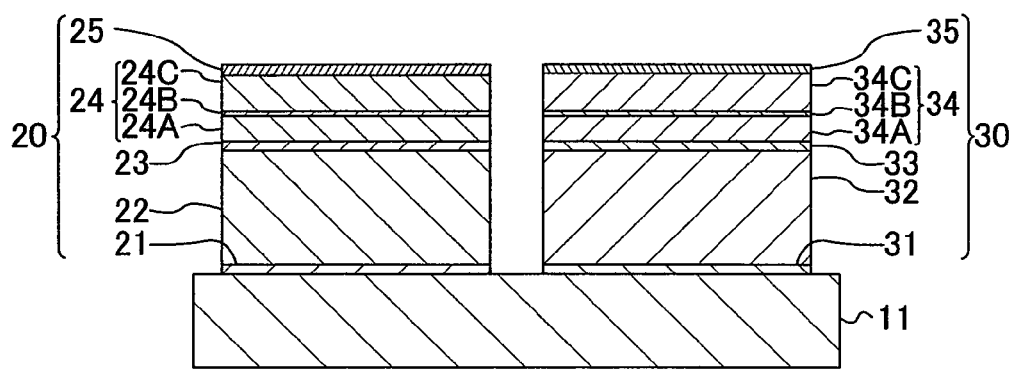
Figure 9C:
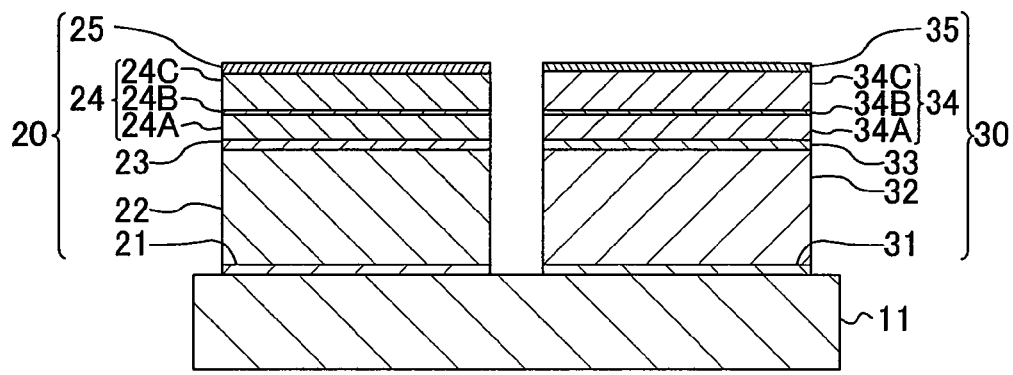

As shown in FIGS. 9A through 9C, a part of the second semiconductor layer 30 which is formed in a formation region of the infrared laser element is then selectively removed. In this process, the first semiconductor layer 20 and the second semiconductor layer 30 are isolated from each other by an element isolation groove. Preferably, a cleavage groove is also formed simultaneously in this process.

Figure 10A:
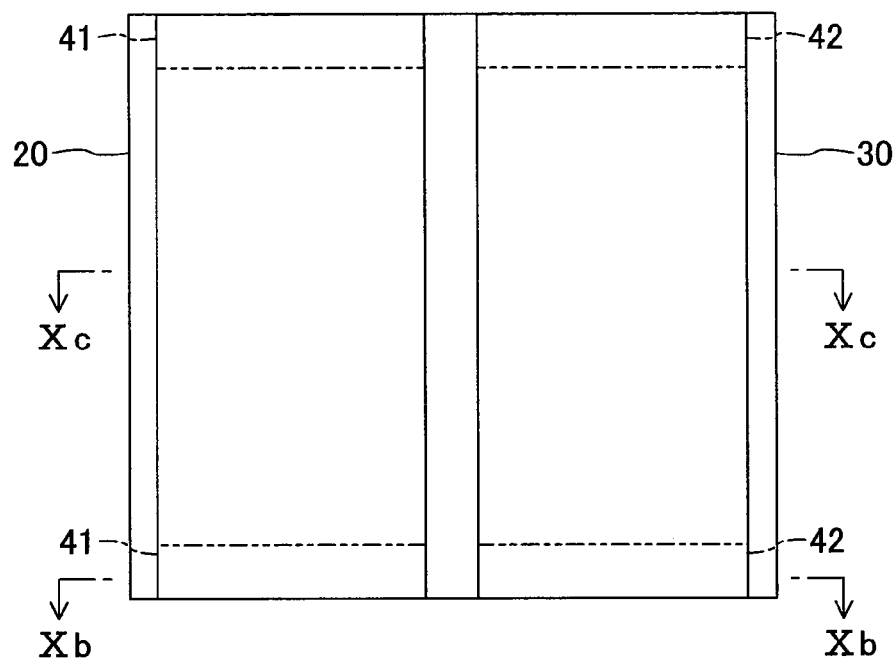
Figure 10B:
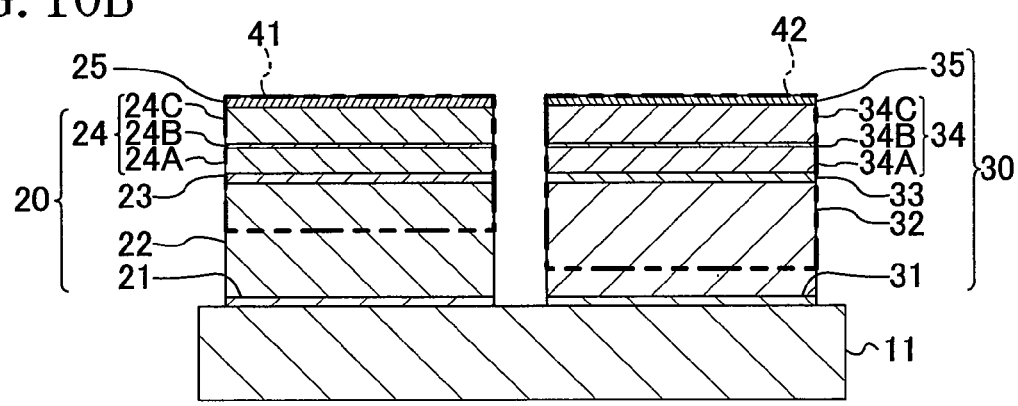
Figure 10C:
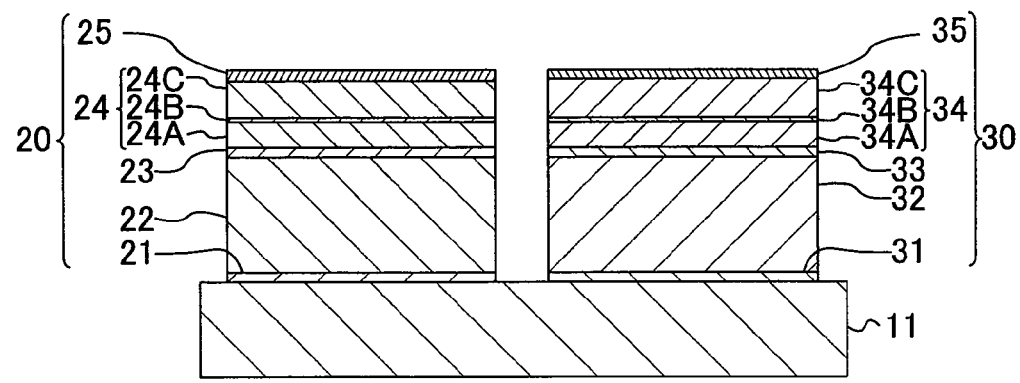

As shown in FIGS. 10A through 10C, a first end face window structure 41 is then formed in the first semiconductor layer 20 and a second end face window structure 42 is formed in the second semiconductor layer 30. The first end face window structure 41 and the second end face window structure 42 can be formed by a known method. For example, a Zn layer serving as an impurity source and a cap layer are selectively formed on the end face region of the first semiconductor layer 20 and the second semiconductor layer 30. Thereafter, heat treatment is performed so that impurities are diffused into the end face region of the first semiconductor layer 20 and the second semiconductor layer 30.

In this embodiment, the first contact layer 25 is thicker than the second contact layer 35, and the first p-type cladding layer 24 is thinner than the second p-type cladding layer 34. Therefore, with the same heat history, impurities are more likely to be diffused in the second semiconductor layer 30 than in the first semiconductor layer 20. As a result, the lower end of the first end face window structure 41 is located higher than the lower end of the second end face window structure 42.

Figure 11A:
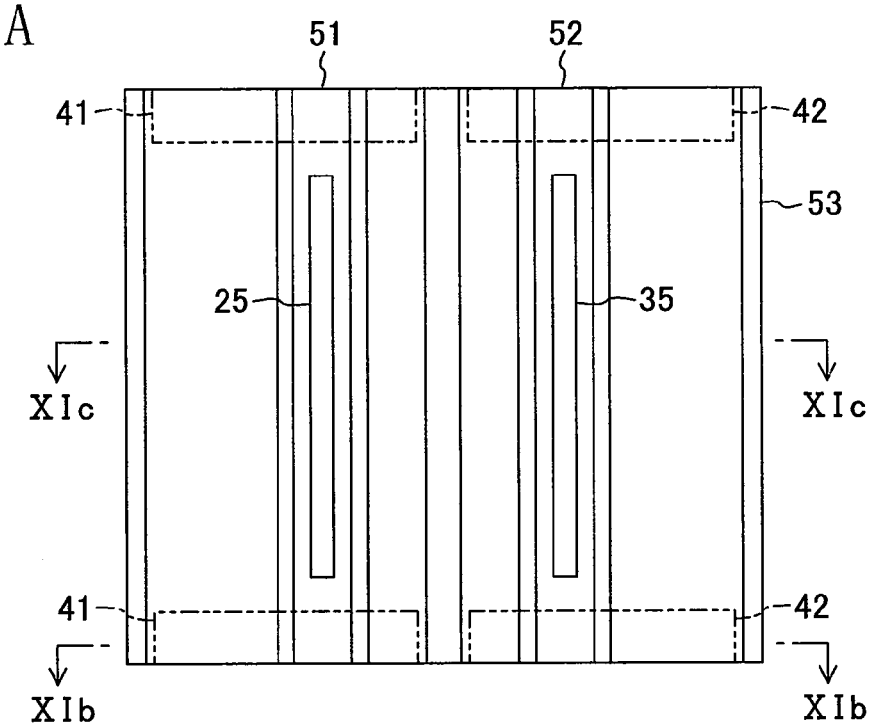
Figure 11B:
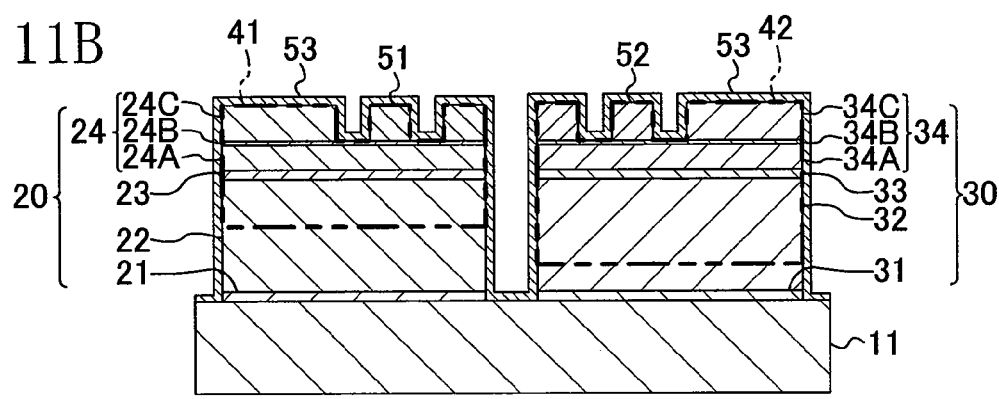
Figure 11C:
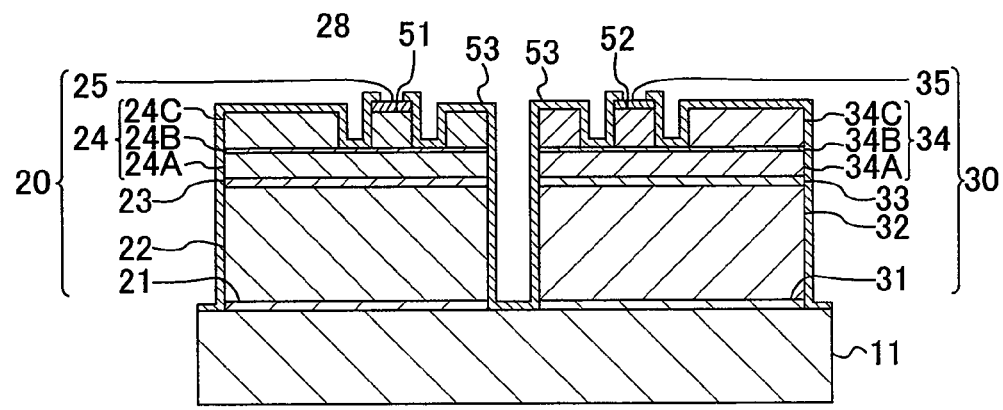

As shown in FIGS. 11A through 11C, the first upper layer 24C and the second upper layer 34C are selectively removed in a stripe shape to form a first ridge stripe region 51 and a second ridge stripe region 52, respectively. In this process, the first contact layer 25 is removed except for a part that is located on the first ridge stripe portion 51 within the gain region, and the second contact layer 35 is removed except for a part that is located on the second ridge stripe portion 52 within the gain region. A current blocking layer 53 is then formed so as to cover the first semiconductor layer 20 and the second semiconductor layer 30. An opening that exposes the first contact layer 25 and an opening that exposes the second contact layer 35 are then formed in the current blocking layer 53.

Figure 12A:
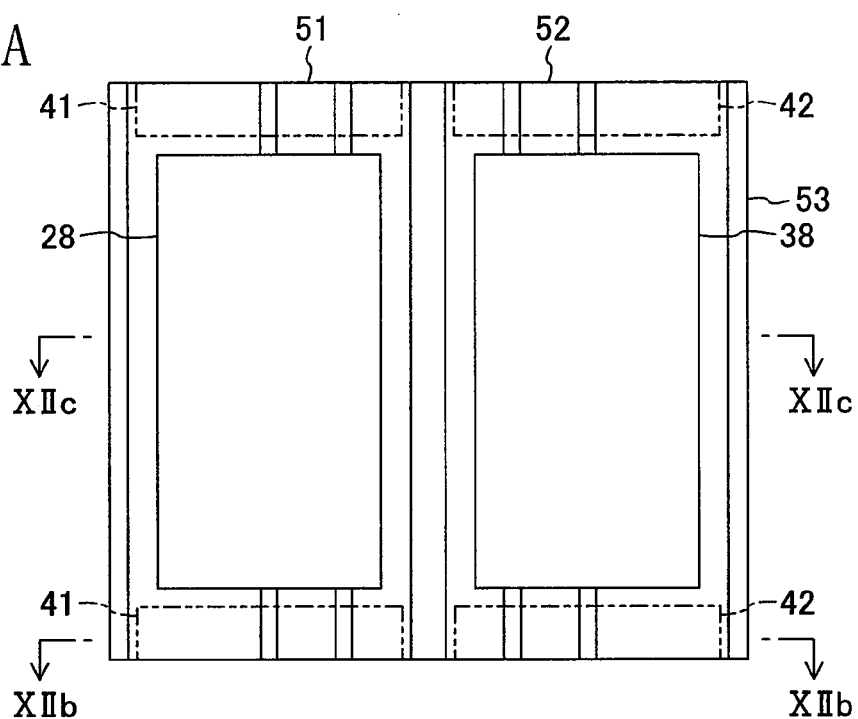
Figure 12B:
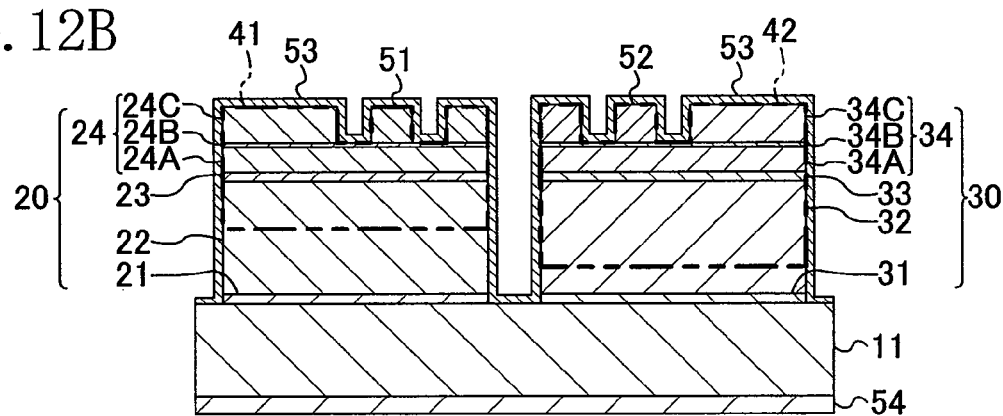
Figure 12C:
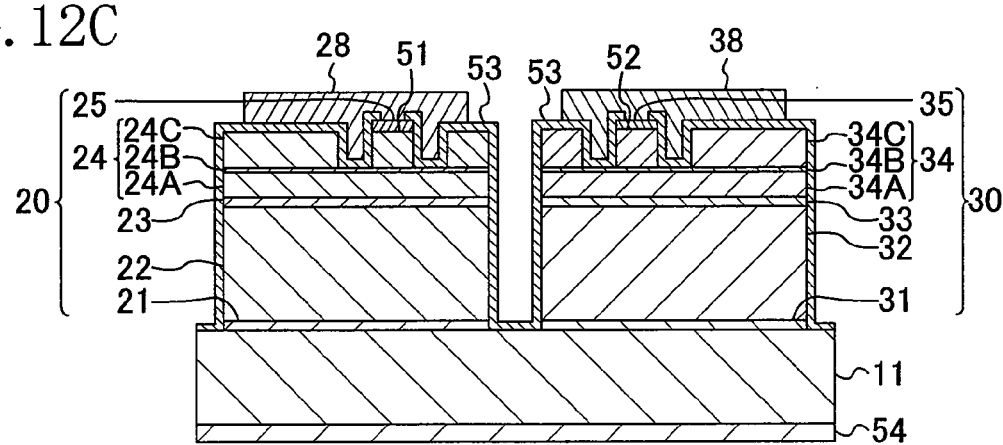

As shown in FIGS. 12A through 12C, a first p-side electrode 28 is formed on the gain region of the first semiconductor layer 20 so as to be in contact with the first contact layer 25, and a second p-side electrode 38 is formed on the gain region of the second semiconductor layer 30 so as to be in contact with the second contact layer 35. An n-type electrode 54 is formed on the rear surface of the semiconductor substrate 11.

The infrared laser element 12 thus has the first semiconductor layer 20 having the first buffer layer 21, the first n-type cladding layer 22, the first active layer 23, and the first p-type cladding layer 24 sequentially formed on the semiconductor substrate 11.

In this embodiment, the first contact layer 25 is thicker than the second contact layer 35, the first p-type cladding layer 24 is thinner than the second p-type cladding layer 34, and the Al (aluminum) composition ratio of the first etch stop layer 24B is higher than that of the second etch stop layer 34B. The impurity diffusion rate in the first semiconductor layer 20 is therefore lower than that in the second semiconductor layer 30. Therefore, even when the first end face window structure 41 and the second end face window structure 42 are formed in the same impurity diffusion process, the distance from the lower end of the first active layer 23 to the lower end of the first end face window structure 41 is equal to or shorter than the distance from the lower end of the second active layer 33 to the lower end of the second end face window structure 42.

The difference in thickness between the first contact layer 25 and the second contact layer 35, the difference in thickness between the first p-type cladding layer 24 and the second p-type cladding layer 34, and the difference in composition between the first etch stop layer 24B and the second etch stop layer 34B, the difference in composition between the first contact layer 25 and the second contact layer 35, and the like are parameters for controlling the impurity diffusion rate. In order to control the impurity diffusion rate, any of the above parameters may be used, and a plurality of parameters may be combined. The difference in composition between the first diffusion layer 23 and the second diffusion layer 33 also affects the impurity diffusion rate.

Figure 13:
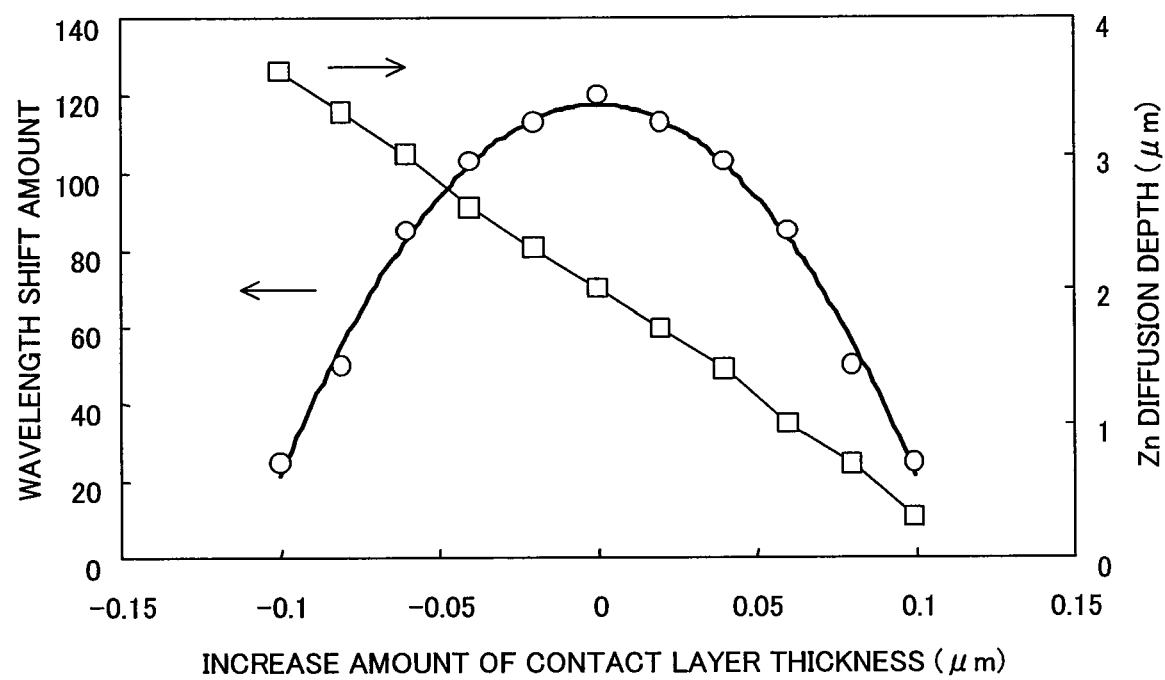
FIG. 13 is a graph showing a relation between a contact layer thickness and a wavelength shift amount in an infrared laser element in the semiconductor laser device of the first embodiment.

FIG. 13 shows a relation between a change amount of the thickness of the first contact layer 25 and a wavelength shift amount and an impurity diffusion depth. In FIG. 13, the abscissa indicates a change amount of the thickness of the first contact layer 24. It is herein assumed that the thickness of the first contact layer 25 is zero when the wavelength shift amount is 120 nm. The impurity diffusion depth and the wavelength shift amount change with a change in the thickness of the first contact layer 25. In other words, the distance from the lower end of the first active layer 23 to the lower end of the first end face window structure 41 can be changed by changing the thickness of the first contact layer 25.

In the case where the impurity diffusion rate is controlled by the difference in thickness between the first contact layer 25 and the second contact layer 35, it is preferable to make the first contact layer 25 thicker than the second contact layer 35 by 0.02 µm or more.

In view of easiness in obtaining contact with the electrode, it is preferable that the first contact layer 25 and the second contact layer 35 have a thickness of 0.1 µm or more. On the other hand, the first contact layer 25 and the second contact layer 35 having a large thickness makes it difficult to form the ridge stripe portions. Therefore, it is preferable to determine the respective thicknesses of the first contact layer 25 and the second contact layer 35 so that the ridge stripe portions have a height of about 2 µm.

The respective thicknesses of the first p-type cladding layer 24 and the second p-type cladding layer 35 can be adjusted by the respective thicknesses of the first upper layer 24C and the second upper layer 34C. However, in order to form the first ridge stripe portion 51 and the second ridge stripe portion 52 simultaneously, it is preferable that the total thickness of the first contact layer 25 and the first p-type cladding layer 24 is approximately equal to the total thickness of the second contact layer 35 and the second p-type cladding layer 34. It is also preferable that the first upper layer 24C and the second upper layer 34C have a thickness of 1.4 µm or more in view of light confinement efficiency. On the other hand, the first upper layer 24C and the second upper layer 34C having a large thickness may increase the element resistance. Therefore, it is preferable that the first upper layer 24C and the second upper layer 34C have a thickness of 1.8 μm or less.

The impurity diffusion rate increases with an increase in the Al composition ratio. Therefore, the impurity diffusion rate may be controlled by varying the Al composition ratio between the first contact layer 25 and the second contact layer 35. In this case, it is preferable that the first contact layer 25 and the second contact layer 35 are made of $Al_xGa_{1-x}As$ ($0 \leq x \leq 1$) and the Al composition ratio of the first contact layer 25 is smaller than that of the second contact layer 35 by 0.2 or more. Since Al included in the contact layer facilitates formation of an oxide at the surface of the contact layer, the contact resistance increases due to an interface state. Therefore, it is preferable that the first contact layer 25 and the second contact layer 35 have an Al composition ratio of 0.4 or less.

The first contact layer 25 and the second contact layer 35 may be a layered film. In this case, the Al composition ratio of a layer having the highest Al composition ratio in the first contact layer 25 is made lower than that of a layer having the highest Al composition ratio in the second contact layer 35.

The composition of the first etch stop layer 24B and the second etch stop layer 34B also affects impurity diffusion. By using the first etch stop layer 24B made of an As (arsenic)-based material as in this embodiment, the impurity diffusion rate in the first semiconductor layer 20 can be suppressed. However, since the first etch stop layer 24B needs to have such a composition that does not cause light absorption for infrared laser wavelengths, it is preferable to use $Al_xGa_{1-x}As$ ($0.2 \leq x \leq 1$).

The first upper layer 24C and the second upper layer 34C may be made of materials having different composition ratios of Al, Ga, and In. However, it is preferable that the etching rate is not significantly different between the first upper layer 24C and the second upper layer 34C in the step of forming the ridge stripe portions. Therefore, it is preferable to adjust the composition ratio in view of the difference in thickness between the first contact layer 25 and the second contact layer 35 and the respective compositions thereof.

Second Embodiment

Figure 14:
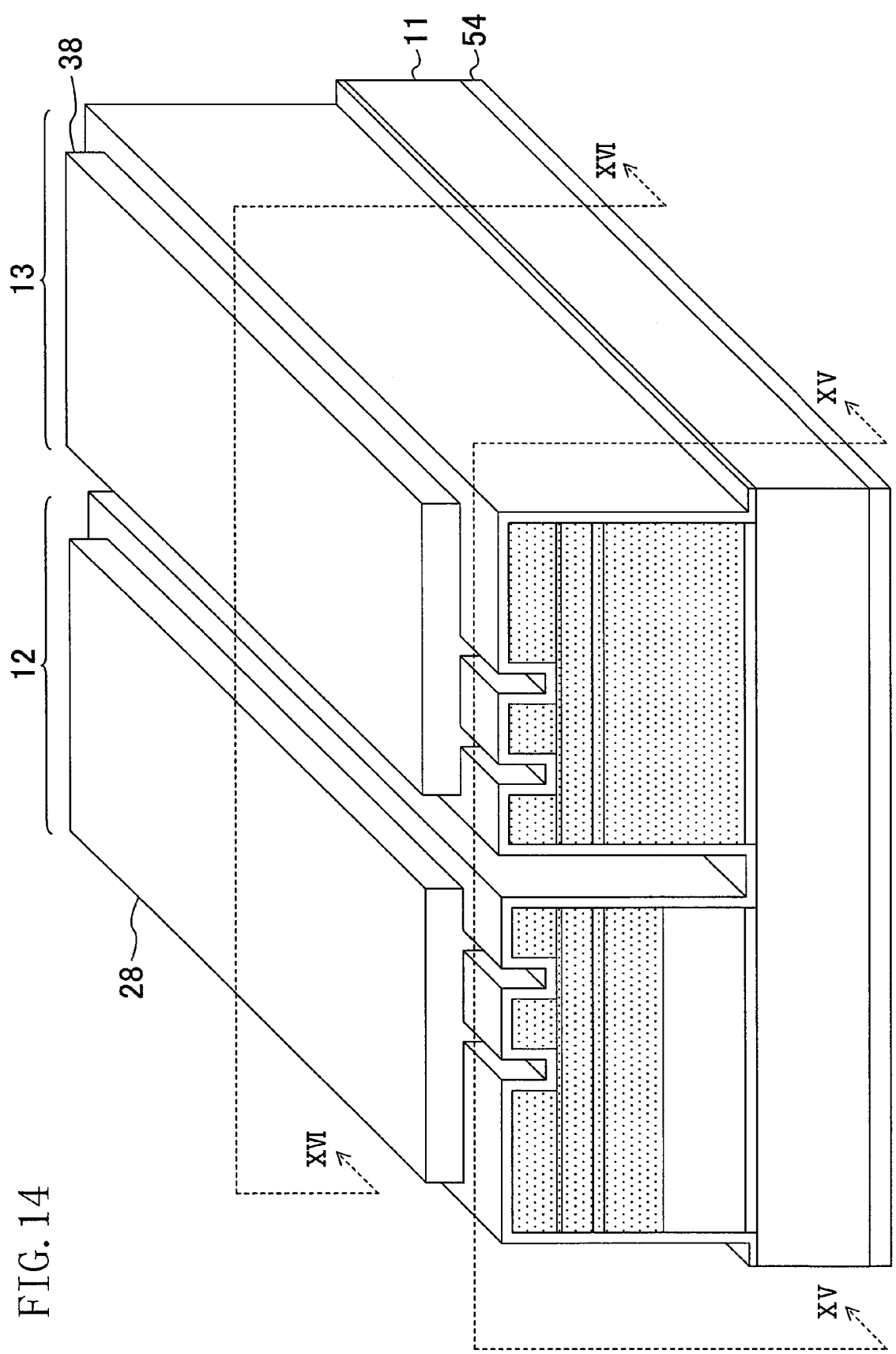
FIG. 14 is a bird's eye view of a semiconductor laser device according to a second embodiment of the invention.
Figure 15:
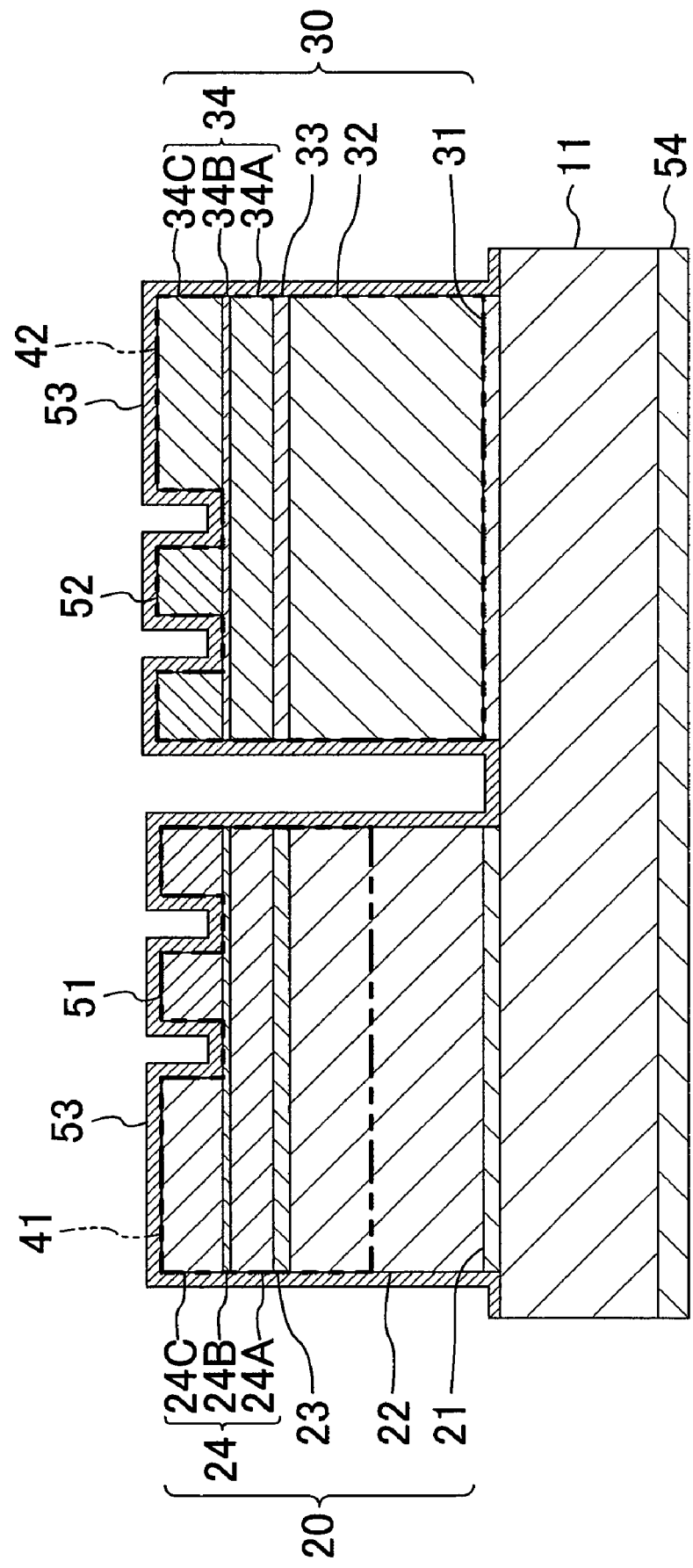
FIG. 15 is a cross-sectional view of the semiconductor laser device of the second embodiment taken along line XV-XV in FIG. 14.
Figure 16:
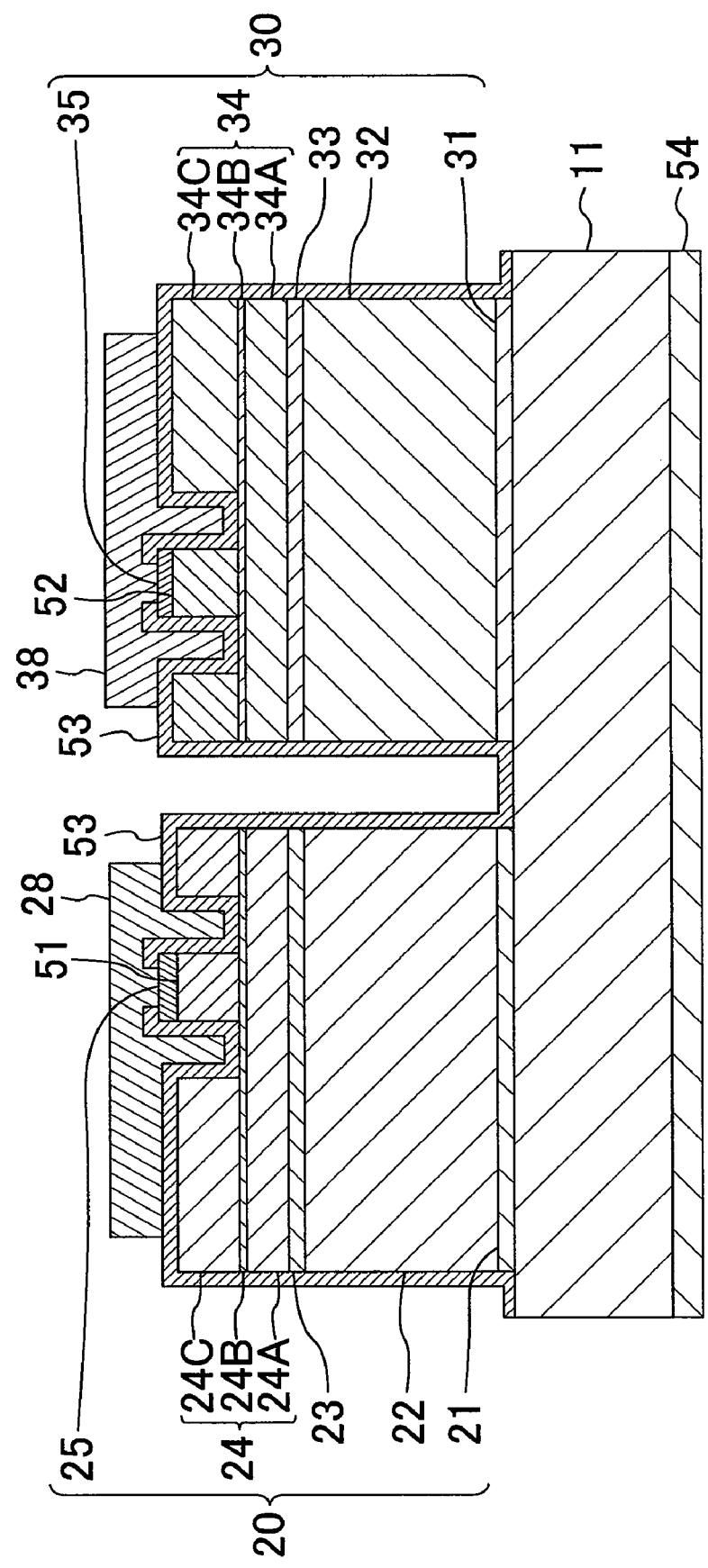
FIG. 16 is a cross-sectional view of the semiconductor laser device of the second embodiment taken along line XVI-XVI in FIG. 14.

Hereinafter, a second embodiment of the invention will be described with reference to the figures. FIG. 14 shows a structure of a semiconductor laser device according to the second embodiment. FIG. 15 shows a cross-sectional structure taken along line XV-XV in FIG. 14, and FIG. 16 shows a cross-sectional structure taken along line XVI-XVI in FIG. 14. In FIGS. 14 through 16, the same elements as those in FIGS. 1 through 3 are denoted with the same reference numerals and characters, and description thereof will be omitted.

In the semiconductor laser device of the second embodiment, the lower end of the first end face window structure 41 of the infrared laser element 12 does not reach the lower end of the first n-type cladding layer 22, and the lower end of the second end face window structure 42 of the red laser element 13 reaches the lower end of the second n-type cladding layer 32.

In the semiconductor laser device of this embodiment, the composition of the second buffer layer 31 is AlGaAs and the composition of the second n-type cladding layer 32 is AlGaInP. AlGaAs used for the second buffer layer 31 has a significantly lower Zn diffusion rate than that of AlGaInP used for the second n-type cladding layer 32. Therefore, diffusion of Zn stops when Zn reaches the lower end of the second n-type cladding layer 32. The second buffer layer 31 thus functions as an impurity diffusion preventing layer.

The second buffer layer 31 has an Al composition ratio of 0.17 to 1. Accordingly, the bandgap of the second buffer layer 31 is wider than the bandgap (650 nm, 1.9 eV) of the second active layer 33. Therefore, current leakage from the second end face window structure 42 to the semiconductor substrate 11 can be suppressed.

The second buffer layer 31 may have a multilayer structure. In this case, the Al composition ratio in the second buffer layer 31 is gradually increased from the side of the semiconductor substrate 11. With this structure, generation of a band spike at the respective interfaces with the semiconductor substrate 11 and the second n-type cladding layer 32 can be buffered, whereby the element resistance can further be reduced.

Figure 17:
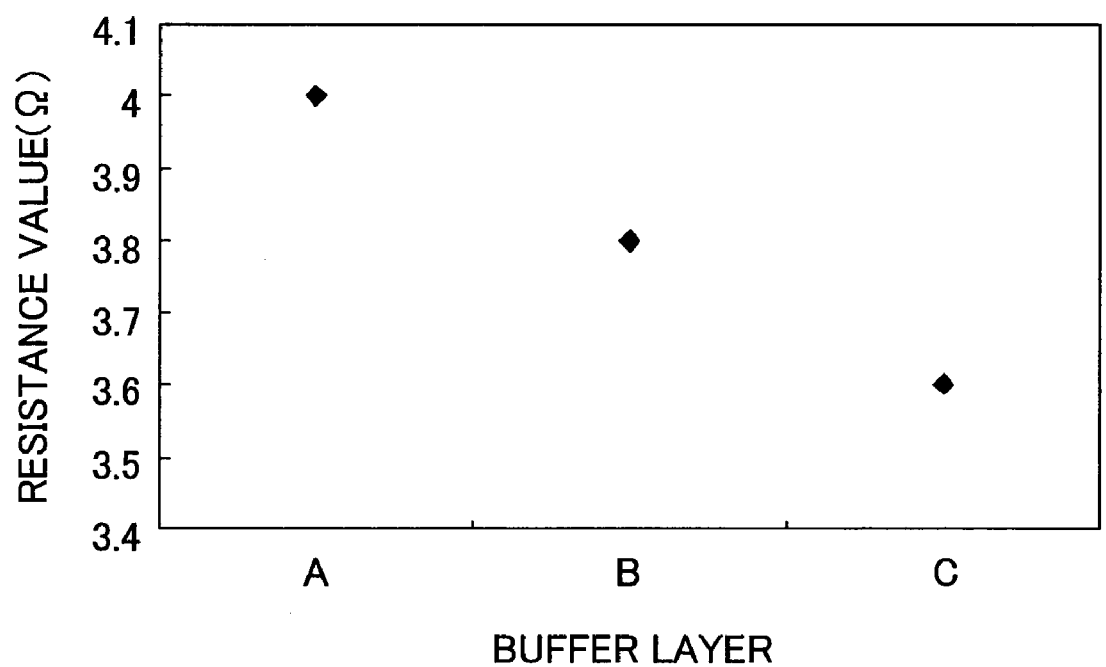
FIG. 17 is a graph showing a relation between the structure of a buffer laser and a resistance value in a red laser element in the semiconductor laser device of the second embodiment.

FIG. 17 shows a relation between the structure of the second buffer layer 31 and the element resistance of the infrared laser element 13. In FIG. 17, A indicates that the second buffer layer 31 is a single layer of GaAs, and B indicates that the second buffer layer 31 is a single layer of $Al_{0.3}Ga_{0.7}As$. C indicates that the second buffer layer 31 is a layered film in which $Al_{0.1}Ga_{0.9}As$, $Al_{0.2}Ga_{0.8}As$, and $Al_{0.3}Ga_{0.7}As$ are sequentially formed from the side of the substrate. As shown in FIG. 17, the resistance value can be reduced by using the second buffer layer 31 made of AlGaAs. The resistance value can further be reduced by using the second buffer layer 31 having a layered structure.

Note that the number of layers in the second buffer layer 31 is not limited to three, but may be two or four or more. The Al composition ratio in the second buffer layer 31 is not specifically limited as long as the Al composition ratio is gradually increased from the side of the substrate toward the n-type cladding layer. However, in the case where the lower end of the second end face window structure 42 reaches the second buffer layer 31, it is preferable that the top layer of the second buffer layer 31 has an Al composition ratio of 0.17 or more.

FIG. 17 shows an example in which the second buffer layer 31 has a multilayer structure of $Al_xGa_{1-x}As$ ($0 \leq x \leq 1$). However, the multilayer structure may be made of a combination of $Al_xGa_{1-x}As$ ($0 \leq x \leq 1$) and $(Al_yGa_{1-y})_zIn_{1-z}P$ ($0 \leq y \leq 1$, $0 \leq z \leq 1$). In this case as well, the Al composition ratio of at least $Al_xGa_{1-x}As$ ($0 \leq x \leq 1$) is set so as to be gradually increased from the side of the substrate.

In addition to the second buffer layer 31, the first buffer layer 21 may also have a multilayer structure. In the semiconductor laser device of the first embodiment as well, the second buffer layer 31 and the first buffer layer 21 may have a multilayer structure. In this case as well, generation of a band spike can be buffered and the element resistance can be reduced.

In the second embodiment, the difference in impurity diffusion between the first end face window structure 41 and the second end face window structure 42 needs to be slightly larger than in the first embodiment. Therefore, for example, the first contact layer 25 and the second contact layer 35 may have a thickness of 0.4 μm and 0.2 μm, respectively. The first p-type cladding layer 24 and the second p-type cladding layer 34 may have a thickness of 1.5 μm and 1.7 μm, respectively. The respective compositions of the first etch stop layer 24B and the second etch stop layer 34B may be $Al_{0.4}Ga_{0.6}As$ and $Ga_{0.5}In_{0.5}P$. The difference in impurity diffusion between the first end face window structure 41 and the second end face window structure 42 may alternatively be produced by changing other parameters.

The semiconductor laser device of the second embodiment can be formed by the same process as that of the manufacturing method of the semiconductor laser device of the first embodiment by forming an AlGaAs layer instead of a GaAs layer as the second buffer layer 31.

Third Embodiment

Figure 18:
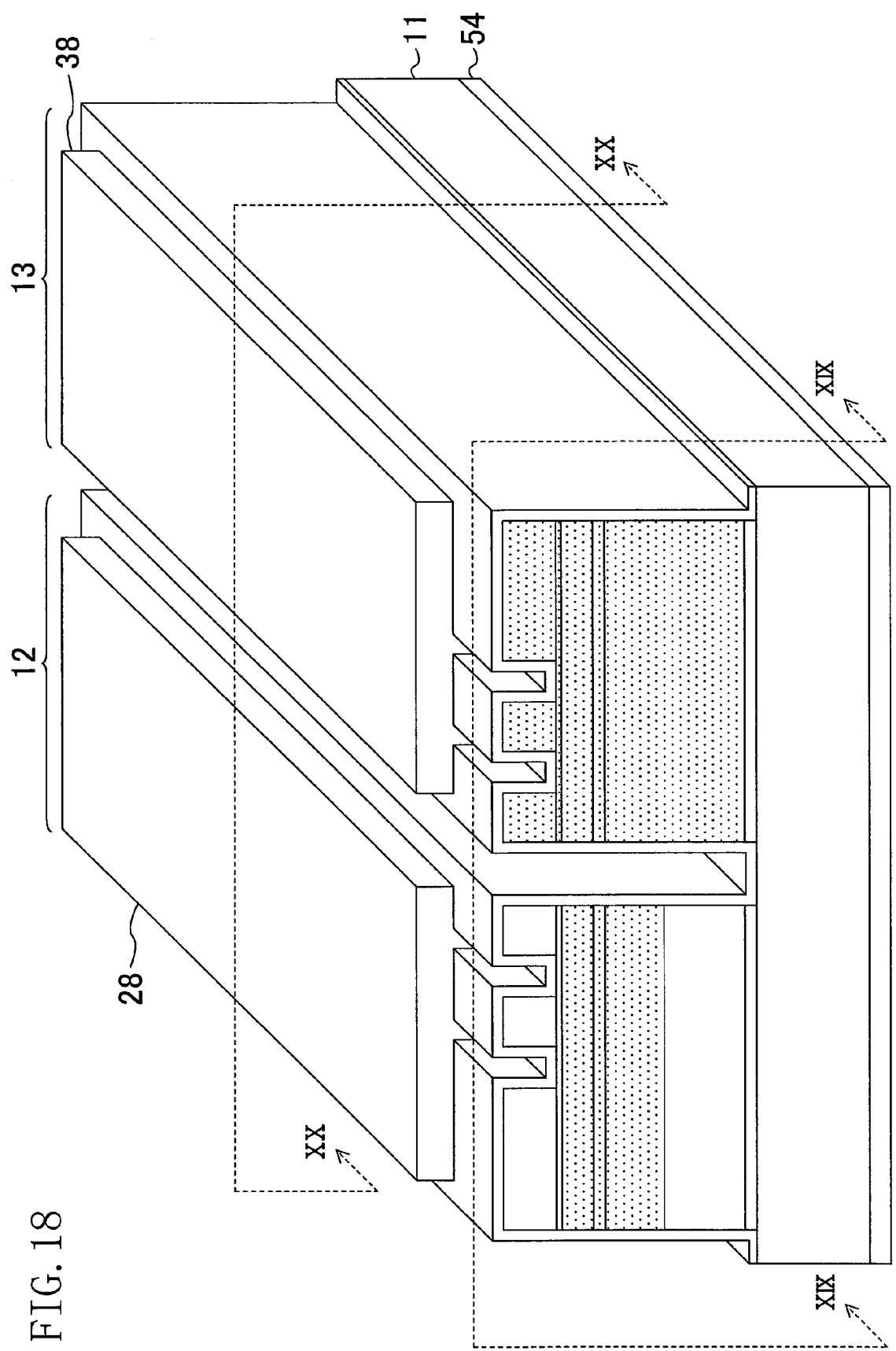
FIG. 18 is a bird's eye view of a semiconductor laser device according to a third embodiment of the invention.
Figure 19:
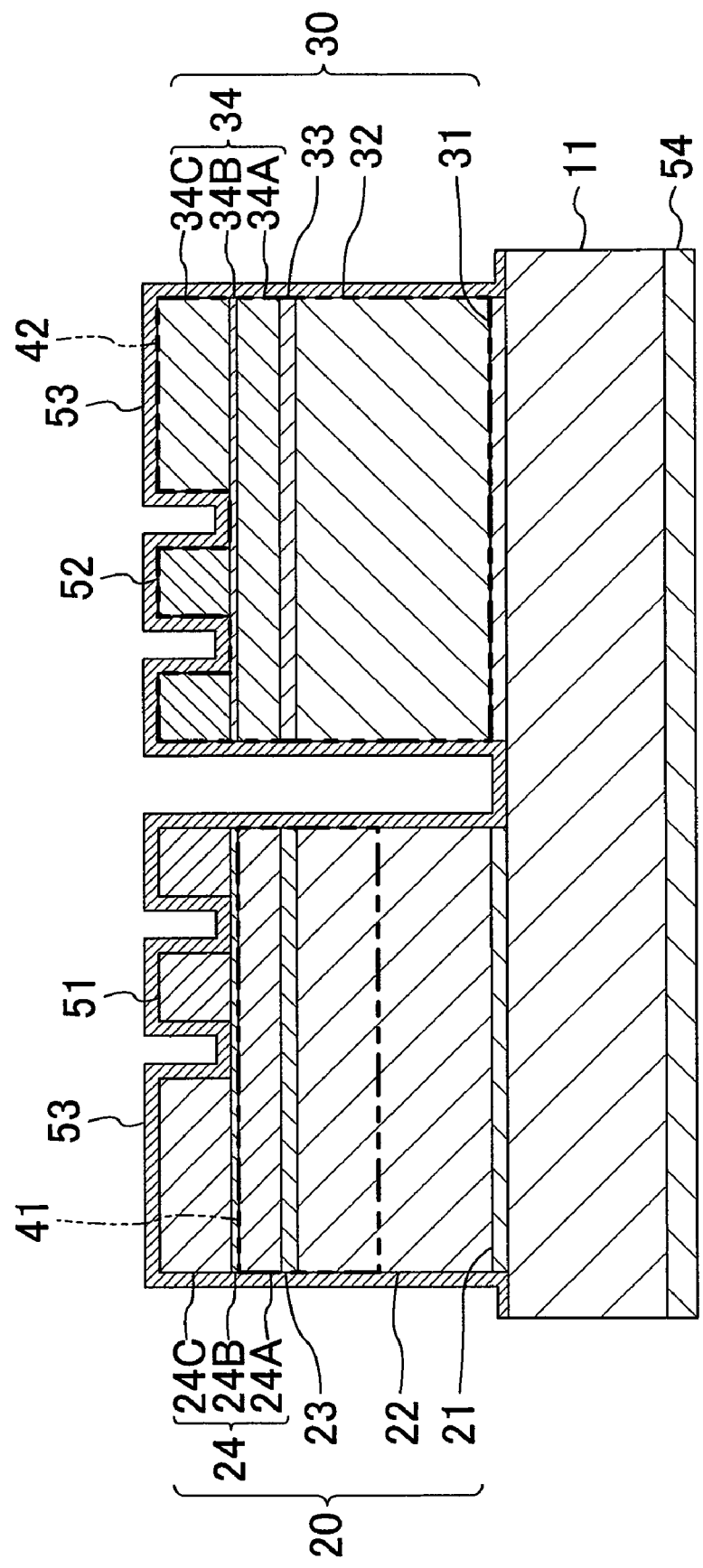
FIG. 19 is a cross-sectional view of the semiconductor laser device of the third embodiment taken along line XIX-XIX in FIG. 18.
Figure 20:
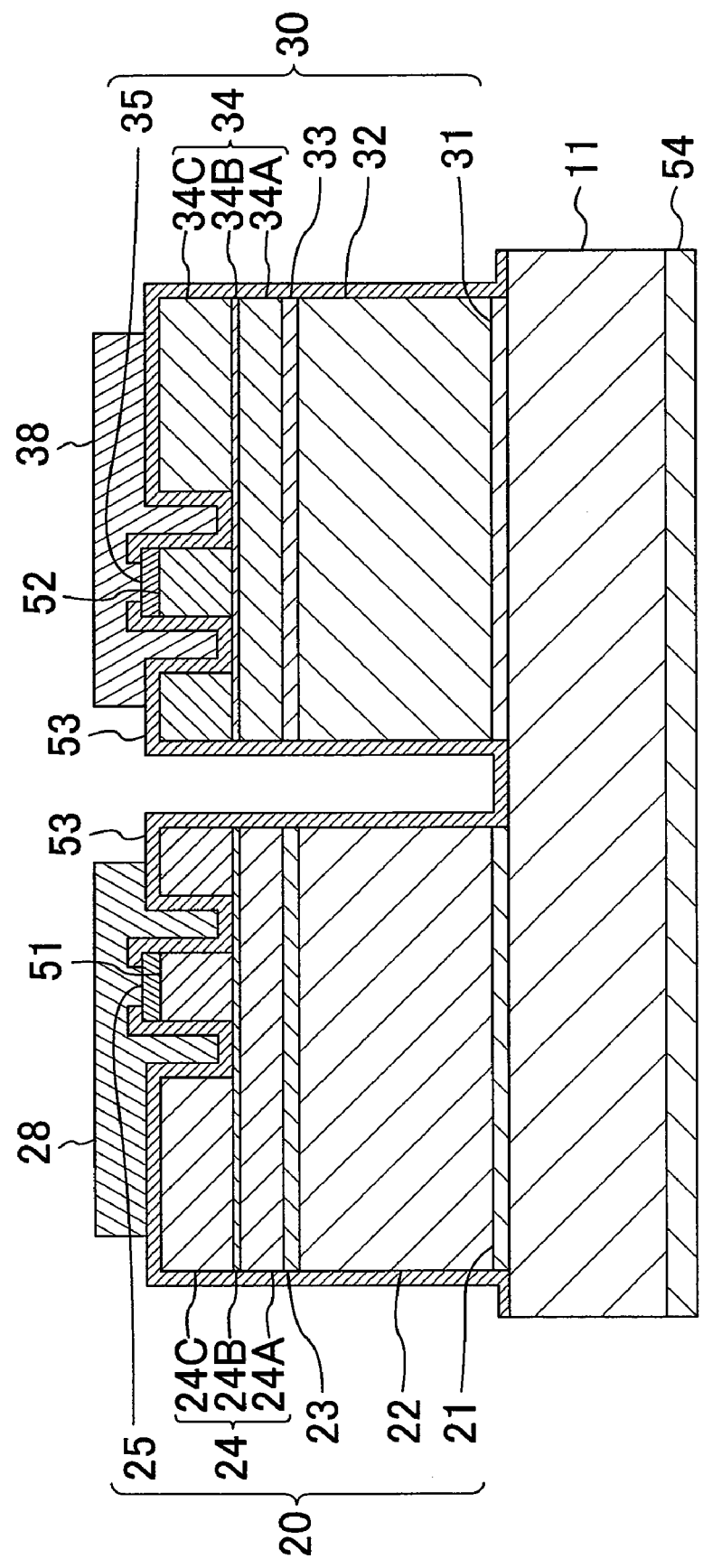
FIG. 20 is a cross-sectional view of the semiconductor laser device of the third embodiment taken along line XX-XX in FIG. 18.

Hereinafter, a third embodiment of the invention will be described with reference to the figures. FIG. 18 shows a structure of a semiconductor laser device according to the third embodiment. FIG. 19 shows a cross-sectional structure taken along line XIX-XIX in FIG. 18, and FIG. 20 shows a cross-sectional structure taken along line XX-XX in FIG. 18. In FIGS. 18 through 20, the same elements as those of FIGS. 1 through 3 are denoted with the same reference numerals and characters, and description thereof will be omitted.

In the semiconductor laser device of the third embodiment, the lower end of the first end face window structure 41 of the infrared laser element 12 does not reach the lower end of the first n-type cladding layer 22, and the lower end of the second end face window structure 42 of the red laser element 13 reaches the lower end of the second n-type cladding layer 32. The first end face window structure 41 is formed below the first etch stop layer 24B.

In the semiconductor laser device of this embodiment, the first end face window structure 41 is formed by ion implantation. Therefore, a semiconductor laser device in which the lower end of the second end face window structure 42 is located lower than the lower end of the first end face window structure 41 can be easily produced.

Hereinafter, a method for manufacturing a semiconductor laser device according to the third embodiment will be described with reference to the figures. In FIGS. 21A through 24C, FIGS. 21A, 22A, 23A, and 24A show a planar structure, FIGS. 21B, 22B, 23B, and 24B show a cross-sectional structure in the gain region, and FIGS. 21C, 22C, 23C, and 24C show a cross-sectional structure in the end face region. Note that, in an actual manufacturing process, a plurality of semiconductor laser devices are formed on a substrate and the substrate is finally cleaved into individual semiconductor laser devices. However, only one semiconductor laser device is shown in the figures for explanation.

Figure 21A:
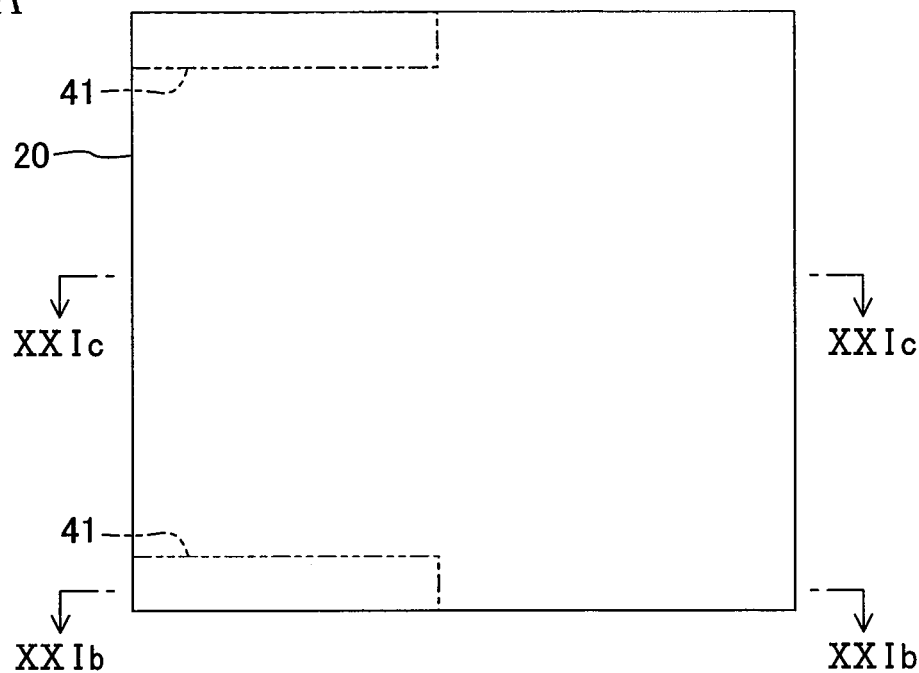
Figure 21B:
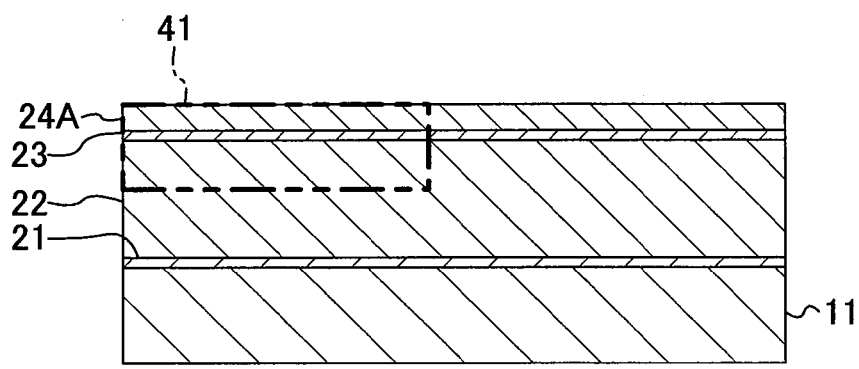
Figure 21C:
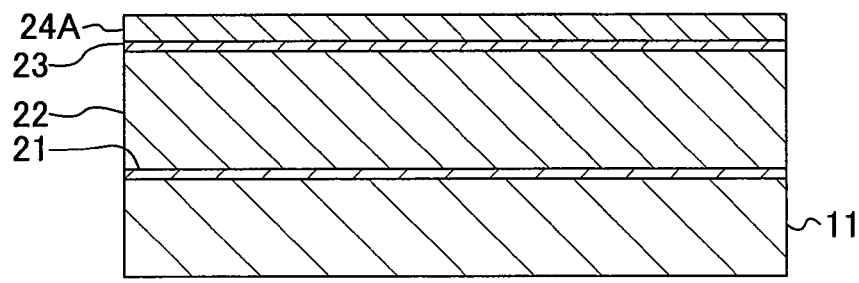

As shown in FIGS. 21A through 21C, a first buffer layer 21, a first n-type cladding layer 22, a first active layer 23, a first lower layer 24A of a first p-type cladding layer 24 are sequentially formed on an n-type GaAs semiconductor substrate 11. The first buffer layer 21 is made of n-type GaAs. The first n-type cladding layer 22 is made of n-type $(Al_yGa_{1-y})_zIn_{1-z}P$ ($0 \leq y \leq 1$, $0 \leq z \leq 1$). The first lower layer 24A is made of p-type $(Al_yGa_{1-y})_zIn_{1-z}P$ ($0 \leq y \leq 1$, $0 \leq z \leq 1$).

Thereafter, impurities are introduced into the first active layer 23 by implanting ions such as Si (silicon) into a region that is to be the first end face window structure 41. Heat treatment for causing disordering does not need to be performed independently after the impurity implantation. The first end face window structure 41 is disordered by heat history in forming the second semiconductor layer and heat treatment for forming the second end face window structure 42 which will be performed later.

Figure 22A:
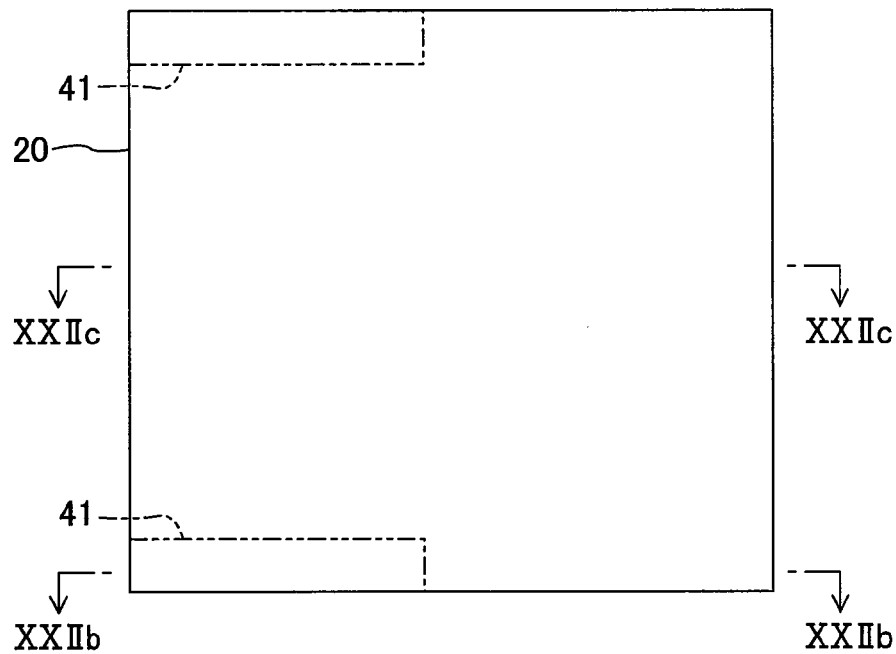
Figure 22B:
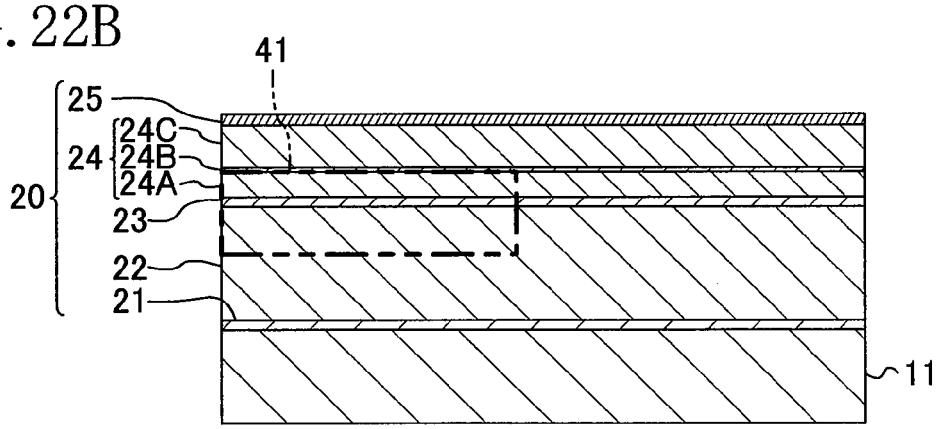
Figure 22C:
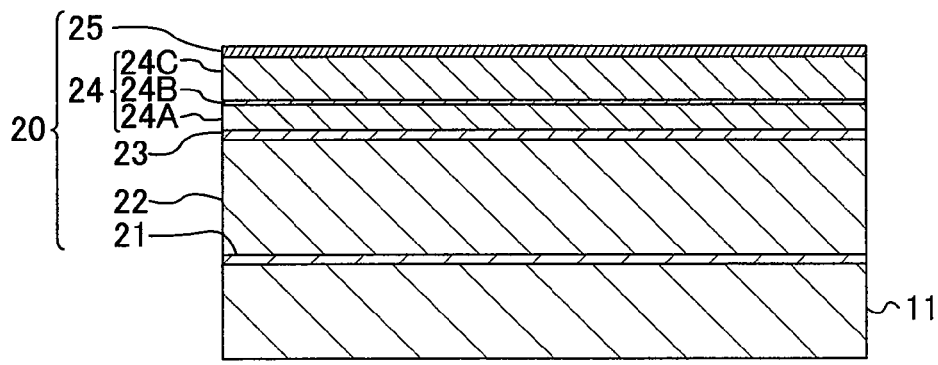

As shown in FIGS. 22A through 22C, a first etch stop layer 24B and a first upper layer 24C and a first contact layer 25 are sequentially formed on the first lower layer 24A, whereby a first semiconductor layer 20 is obtained. The first etch stop layer 24B is made of p-type $Al_xGa_{1-x}As$ ($0 \leq x \leq 1$), and the first upper layer 24C is made of p-type $(Al_yGa_{1-y})_zIn_{1-z}P$ ($0 \leq y \leq 1$, $0 \leq z \leq 1$). The first contact layer 25 is made of $Al_xGa_{1-x}As$ ($0 \leq x \leq 1$).

Figure 23A:
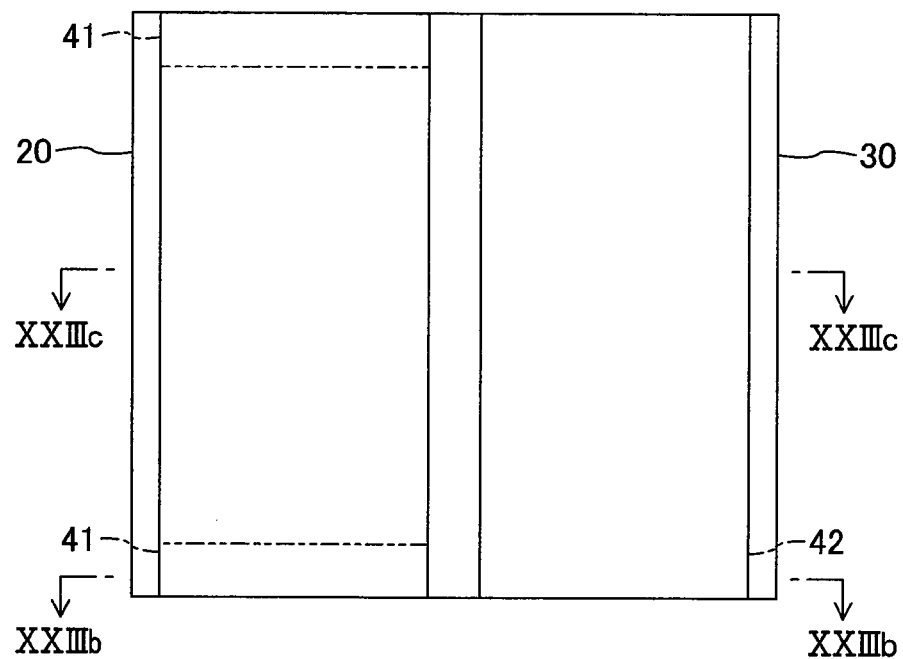
Figure 23B:
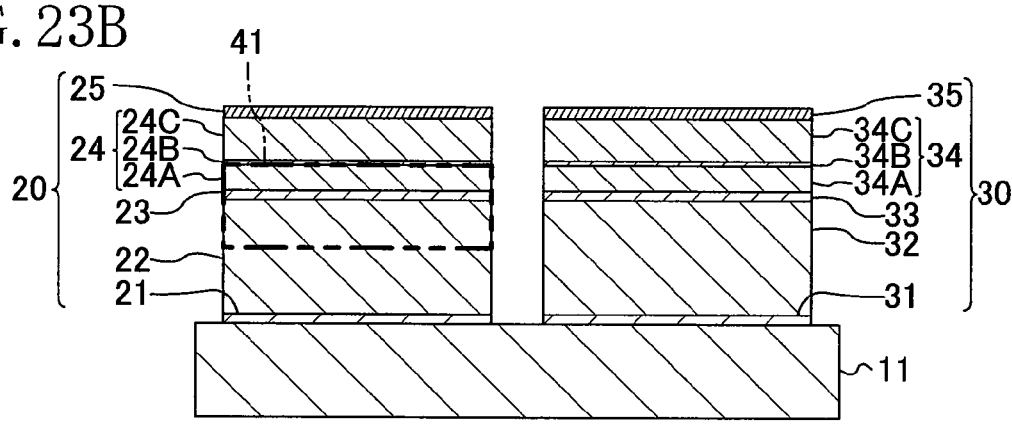
Figure 23C:
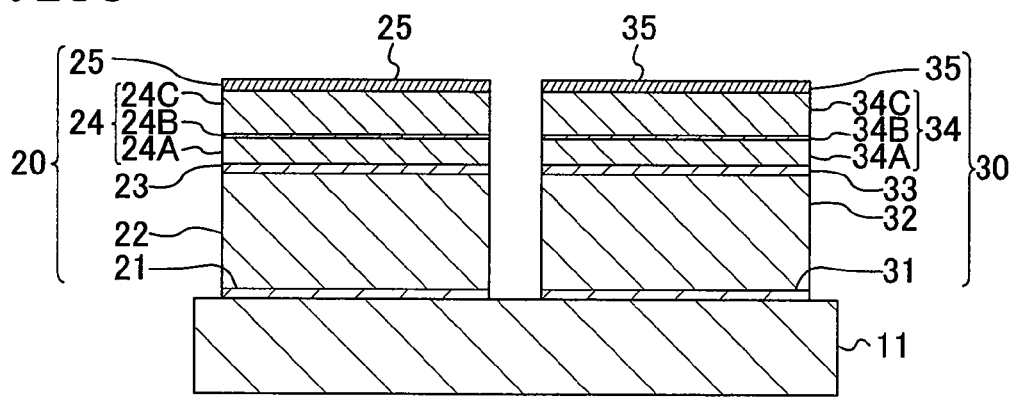

Thereafter, as in the first embodiment, a part of the first semiconductor layer 20 which is formed in a formation region of the red laser element is selectively removed. A second semiconductor layer 30 is then formed by crystal growth, and a part of the second semiconductor layer 30 which is formed in a formation region of the infrared laser element is selectively removed. The first semiconductor layer 20 and the semiconductor layer 30 are thus isolated from each other by an element isolation groove as shown in FIGS. 23A through 23C.

A second buffer layer 31 is made of n-type AlGaAs. Especially the Al composition ratio of the second buffer layer 31 is preferably in the range of 0.1 to 1. A second n-type cladding layer 32 is made of n-type $(Al_yGa_{1-y})_zIn_{1-z}P$ ($0 \leq y \leq 1$, $0 \leq z \leq 1$). A second p-type cladding layer 34 is formed by a second lower layer 34A, a second etch stop layer 34B, and a second upper layer 34C each made of p-type $(Al_yGa_{1-y})_zIn_{1-z}P$ ($0 \leq y \leq 1$, $0 \leq z \leq 1$).

The first semiconductor layer 20 and the second semiconductor layer 30 are preferably formed so that the thickness of the first contact layer 25 is equal to or larger than that of the second contact layer 35. In this embodiment, the first contact layer 25 and the second contact layer 35 have a thickness of 0.2 μm. It is preferable that the thickness of the first p-type cladding layer 24 is equal to or smaller than that of the second p-type cladding layer 34. In this embodiment, the first upper layer 24C of the first p-type cladding layer 24 and the second upper layer 34C of the second p-type cladding layer 34 have a thickness of 1.6 μm.

Figure 24A:
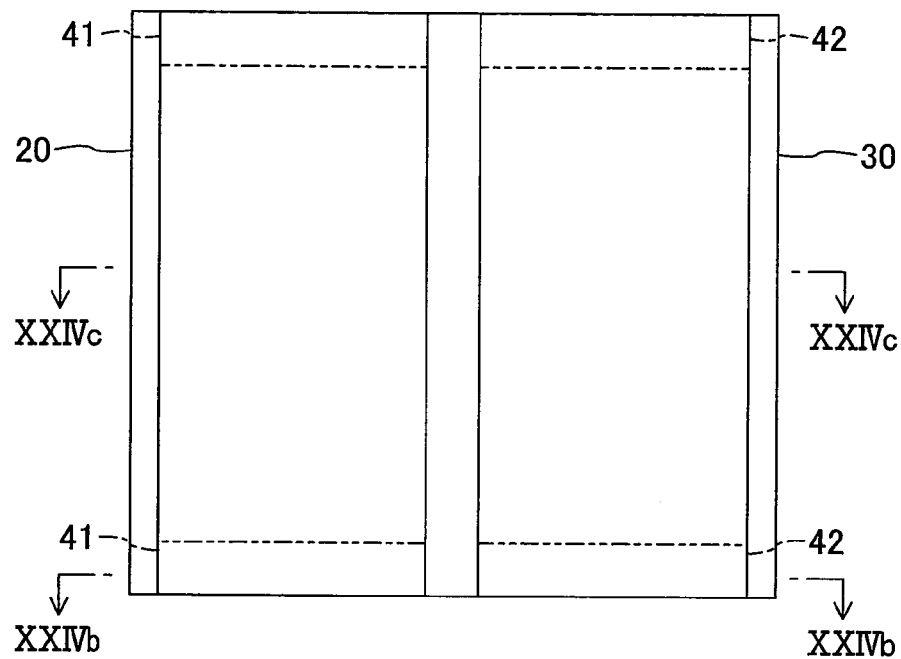
Figure 24B:
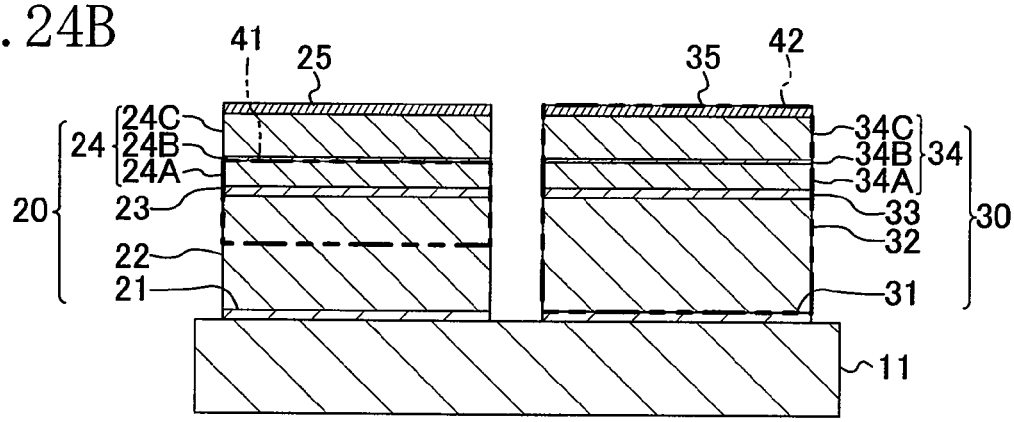
Figure 24C:
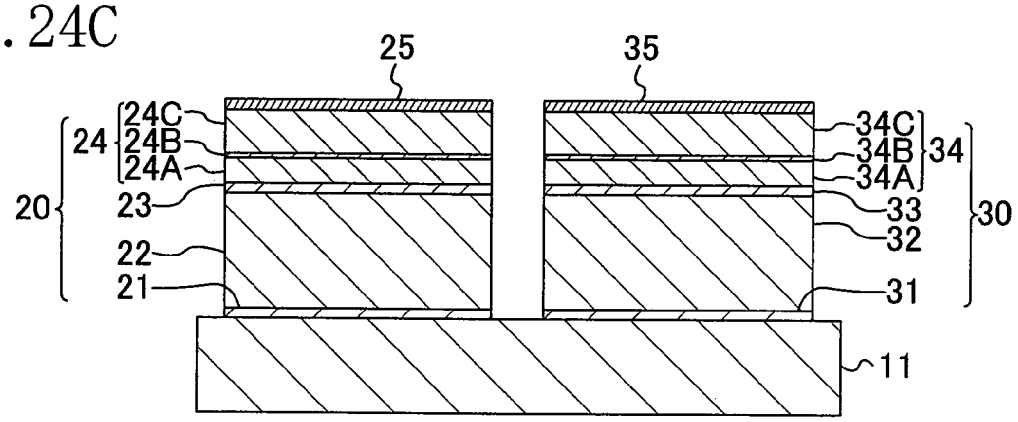

As shown in FIGS. 24A through 24C, a second end face window structure 42 is then formed in the second semiconductor layer 30. The second end face window structure 42 can be formed by a know method. For example, a Zn layer serving as an impurity source and a cap layer are selectively formed on the end face region of the first semiconductor layer 20 and the second semiconductor layer 30. Thereafter, heat treatment is performed so that impurities are diffused into the end face region of the second semiconductor layer 30.

In this embodiment, the composition of the second buffer layer 31 is AlGaAs and the composition of the second n-type cladding layer 32 is AlGaInP. AlGaAs of the second buffer layer 31 has a significantly lower Zn diffusion rate than that of AlGaInP of the second n-type cladding layer 32. Therefore, diffusion of Zn stops when Zn reaches the lower end of the second n-type cladding layer 32.

Thereafter, as in the first embodiment, ridge stripe portions, a current blocking layer, electrodes, and the like are formed, whereby a semiconductor laser device having an infrared laser element 12 and a red laser element 13 is formed.

In the manufacturing method of the semiconductor laser device of this embodiment, different kinds of impurities are diffused in the infrared laser element and the red laser element. Therefore, in formation of the end face window structures, disordering and equalization of the composition of the active layer can be performed optimally for each laser element under the same annealing conditions without any additional heat history.

This embodiment shows an example in which the lower end of the second end face window structure 42 reaches the lower end of the second n-type cladding layer 32. However, as in the first embodiment, the lower end of the second end face window structure 42 does not need to reach the lower end of the second n-type cladding layer 32 as long as the distance from the lower end of the second active layer 33 to the lower end of the second end face window structure 42 is longer than the distance from the lower end of the first active layer 23 to the lower end of the first end face window structure 41.

In this embodiment, impurities are implanted before formation of the first etch stop layer 24B, the first upper layer 24C, and the like in order to efficiently introduce the impurities into the first active layer 23. However, impurities may alternatively be implanted after formation of the first etch stop layer 24B, the first upper layer 24C, and the like.

A dual-wavelength semiconductor laser device is shown in each of the above embodiments. However, the same effects can be obtained in a multi-wavelength semiconductor laser device having two or more wavelengths.

As has been described above, the semiconductor laser device and the manufacturing method thereof according to the invention can implement a high-power, low-cost, monolithic dual- or multi-wavelength semiconductor laser device, and is useful as a monolithic semiconductor laser device and a manufacturing method thereof, and the like.

The description of the embodiments of the present invention is given above for the understanding of the present invention. It will be understood that the invention is not limited to the particular embodiments described herein, but is capable of various modifications, rearrangements, and substitutions as will now become apparent to those skilled in the art without departing from the scope of the invention. Therefore, it is intended that the following claims cover all such modifications and changes as fall within the true sprit and scope of the invention.

What is claimed is:

1. A semiconductor laser device, comprising:
a first semiconductor laser element and a second semiconductor laser element formed on a semiconductor substrate of a first conductivity type, wherein
the first semiconductor laser element has a first first-conductivity-type cladding layer, a first active layer including an $Al_xGa_{1-x}As$ layer (where $0 \leq x \leq 1$), a first second-conductivity-type cladding layer, and a first contact layer which are sequentially formed on the semiconductor substrate in this order, and has a first end face window structure that is a region including first impurities and formed near an end face,
the second semiconductor laser element has a second first-conductivity-type cladding layer, a second active layer including an $(Al_yGa_{1-y})_zIn_{1-z}P$ layer (where $0 \leq y \leq 1$, $0 \leq z \leq 1$), a second second-conductivity-type cladding layer, and a second contact layer which are sequentially formed on the semiconductor substrate in this order, and has a second end face window structure that is a region including second impurities and formed near an end face,
at least one of the first first-conductivity-type cladding layer and the first second-conductivity-type cladding layer contains indium (In),
a lower end of the first end face window structure is located above a lower end of the first first-conductivity-type cladding layer, and
a distance from a lower end of the first active layer to the lower end of the first end face window structure is shorter than a distance from a lower end of the second active layer to a lower end of the second end face window structure.

2. The semiconductor laser device according to claim 1, wherein an upper end of the first end face window structure is located below an upper end of the first second-conductivity-type cladding layer.

3. The semiconductor laser device according to claim 1, wherein the lower end of the second end face window structure is located above a lower end of the second first-conductivity-type cladding layer.

4. The semiconductor laser device according to claim 1, wherein the second semiconductor laser element has a buffer layer formed between the semiconductor substrate and the second first-conductivity-type cladding layer, the second active layer has a narrower bandgap than that of the buffer layer, and the lower end of the second end face window structure reaches the buffer layer.

5. The semiconductor laser device according to claim 4, wherein the buffer layer is made of $(Al_yGa_{1-y})_zIn_{1-z}P$ (where $0 \leq y \leq 1$, $0 \leq z \leq 1$) or $Al_xGa_{1-x}As$ (where $0 \leq x \leq 1$).

6. The semiconductor laser device according to claim 4, wherein the buffer layer is a multilayer film made of $(Al_yGa_{1-y})_zIn_{1-z}P$ (where $0 \leq y \leq 1$, $0 \leq z \leq 1$) or $Al_xGa_{1-x}As$ (where $0 \leq x \leq 1$), and an Al composition ratio in each layer of the buffer layer is gradually increased from a side of the semiconductor substrate toward the second first-conductivity-type cladding layer.

7. The semiconductor laser device according to claim 1, wherein the first contact layer and the second contact layer are a single-layer or multilayer film made of $Al_xGa_{1-x}As$ (where $0 \leq x \leq 1$), and the first contact layer has a thickness equal to or more than that of the second contact layer.

8. The semiconductor laser device according to claim 1, wherein the first contact layer and the second contact layer are a single-layer or multilayer film made of $Al_xGa_{1-x}As$ (where $0 \leq x \leq 1$), and the first contact layer has an Al composition ratio equal to or less than that of the second contact layer.

9. The semiconductor laser device according to claim 1, wherein the first second-conductivity-type cladding layer and the second second-conductivity-type cladding layer are a single-layer or multilayer film made of $(Al_yGa_{1-y})_zIn_{1-z}P$ (where $0 \leq y \leq 1$, $0 \leq z \leq 1$), and the first second-conductivity-type cladding layer has a thickness equal to or less than that of the second second-conductivity-type cladding layer.

10. The semiconductor laser device according to claim 1, wherein the first second-conductivity-type cladding layer and the second second-conductivity-type cladding layer are a single-layer or multilayer film made of $(Al_yGa_{1-y})_zIn_{1-z}P$ (where $0 \leq y \leq 1$, $0 \leq z \leq 1$), and the first second-conductivity-type cladding layer has an Al composition ratio equal to or less than that of the second second-conductivity-type cladding layer.

11. The semiconductor laser device according to claim 1, wherein the first second-conductivity-type cladding layer and the second second-conductivity-type cladding layer include a first etch stop layer and a second etch stop layer, respectively, the first etch stop layer is a single-layer or multilayer film made of $Al_xGa_{1-x}As$ (where $0 \leq x \leq 1$), and the second etch stop layer is a single-layer or multilayer film made of $(Al_yGa_{1-y})_zIn_{1-z}P$ (where $0 \leq y \leq 1$, $0z \leq 1$).

12. The semiconductor laser device according to claim 1, wherein the first first-conductivity-type cladding layer, the first active layer, the first second-conductivity-type cladding layer, and the first contact layer are formed by single continuous crystal growth, and the second first-conductivity-type cladding layer, the second active layer, the second second-conductivity-type cladding layer, and the second contact layer are formed by single continuous crystal growth.

13. The semiconductor laser device according to claim 1, further comprising a current blocking layer for limiting a current injection position in the first active layer and the second active layer, wherein the current blocking layer is an insulating layer.

14. The semiconductor laser device according to claim 1, further comprising a current blocking layer for limiting a current injection position in the first active layer and the second active layer, wherein the current blocking layer is a semiconductor layer of a first conductivity type.

15. The semiconductor laser device according to claim 1, wherein the first impurities and the second impurities are a same material.

16. The semiconductor laser device according to claim 1, wherein the first impurities and the second impurities are zinc (Zn) or silicon (Si).

17. A method for manufacturing a semiconductor laser device, comprising the steps of:
  (a) forming on a semiconductor substrate of a first conductivity type a first semiconductor layer having a first first-conductivity-type cladding layer, a first active layer including an $Al_xGa_{1-x}As$ layer (where $0 \leqq x \leqq 1$), and a first second-conductivity-type cladding layer;
  (b) implanting first impurities to an end face region of the first semiconductor layer;
  (c) after the step (b), selectively removing the first semiconductor layer;
  (d) after the step (c), forming a second semiconductor layer having a second first-conductivity-type cladding layer, a second active layer including an $(Al_yGa_{1-y})_zIn_{1-z}P$ layer (where $0 \leqq y \leqq 1$, $0 \leqq z \leqq 1$), and a second second-conductivity-type cladding layer; and
  (e) disordering a region from an upper portion of the second semiconductor layer at least to the second active layer by introducing second impurities to an end face region of the second semiconductor layer.

* * * * *